US011527590B2

(12) United States Patent
Sim et al.

(10) Patent No.: US 11,527,590 B2
(45) Date of Patent: Dec. 13, 2022

(54) LIGHT EMITTING DISPLAY APPARATUS

(71) Applicant: LG Display Co., Ltd., Seoul (KR)

(72) Inventors: Dongmin Sim, Gimpo-si (KR); Wonhoe Koo, Goyang-si (KR); Hyekyung Choi, Seoul (KR); YongCheol Kim, Goyang-si (KR); Kyunghoon Han, Seoul (KR); YoungDock Cho, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/869,132

(22) Filed: May 7, 2020

(65) Prior Publication Data
US 2020/0373366 A1    Nov. 26, 2020

(30) Foreign Application Priority Data

May 20, 2019  (KR) .................. 10-2019-0059005
Nov. 19, 2019  (KR) .................. 10-2019-0148365

(51) Int. Cl.
  *H01L 27/32*  (2006.01)
  *H01L 51/52*  (2006.01)
(52) U.S. Cl.
  CPC ...... *H01L 27/3246* (2013.01); *H01L 51/5218* (2013.01); *H01L 51/5253* (2013.01); *H01L 2251/305* (2013.01)
(58) Field of Classification Search
  CPC ............ H01L 27/3258; H01L 27/3246; H01L 51/5218; H01L 51/5253; H01L 51/5256; H01L 2251/305
  See application file for complete search history.

(56) References Cited

U.S. PATENT DOCUMENTS

| 7,573,070 B2 | 8/2009 | Kang et al. |
| 9,269,754 B2 * | 2/2016 | Lee ............. H01L 51/5218 |
| 9,331,128 B2 | 5/2016 | Tokuda et al. |
| 9,536,931 B2 * | 1/2017 | Kim ............ H01L 51/5271 |
| 2005/0046342 A1 * | 3/2005 | Park ............ H01L 51/5209 |
| | | 313/504 |
| 2008/0180024 A1 * | 7/2008 | Kwon .......... H01L 27/3244 |
| | | 445/24 |
| 2013/0187163 A1 * | 7/2013 | Kim ............ H01L 27/3246 |
| | | 257/59 |

(Continued)

FOREIGN PATENT DOCUMENTS

| KR | 10-2006-0027743 A | 3/2006 |
| KR | 10-0707601 B1 | 4/2007 |

(Continued)

*Primary Examiner* — Vongsavanh Sengdara
(74) *Attorney, Agent, or Firm* — Birch, Stewart, Kolasch & Birch, LLP

(57) ABSTRACT

A light emitting display apparatus according to an exemplary embodiment of the present disclosure includes an insulating layer on a substrate and including a base portion and a protrusion portion having an uneven portion at a part of the base portion, a first electrode covering an upper portion of the base portion and a side portion and a upper portion of the protrusion portion and disposed along the shape of the uneven portion, a bank layer covering a part of the insulating layer and a part of the first electrode, and an emission layer on the first electrode and the bank layer, and a second electrode on the emission layer.

21 Claims, 11 Drawing Sheets

(56) References Cited

U.S. PATENT DOCUMENTS

| | | | |
|---|---|---|---|
| 2015/0380466 A1* | 12/2015 | Koo | H01L 27/322 |
| | | | 438/70 |
| 2017/0062770 A1* | 3/2017 | Jang | H01L 27/3258 |
| 2017/0084669 A1* | 3/2017 | Wolk | H01L 51/5268 |
| 2017/0084875 A1* | 3/2017 | Joung | H01L 51/5262 |
| 2017/0125738 A1* | 5/2017 | Kim | H01L 51/5225 |
| 2017/0155094 A1* | 6/2017 | Joung | H01L 51/56 |
| 2018/0129352 A1* | 5/2018 | Kim | G06F 3/0412 |
| 2018/0190719 A1* | 7/2018 | Kim | H01L 27/326 |
| 2018/0190932 A1* | 7/2018 | Koo | H01L 51/5209 |
| 2018/0247980 A1* | 8/2018 | Jang | H01L 27/3258 |

FOREIGN PATENT DOCUMENTS

| | | |
|---|---|---|
| KR | 10-2013-0085195 A | 7/2013 |
| KR | 10-2015-0039566 A | 4/2015 |
| KR | 10-2015-0118662 A | 10/2015 |

* cited by examiner

LIGHT EMITTING DISPLAY APPARATUS

CROSS-REFERENCE TO RELATED APPLICATIONS

This application claims benefit of and the priority to Korean Patent Application No. 10-2019-0059005 filed on May 20, 2019 and Korean Patent Application No. 10-2019-0148365 filed on Nov. 19, 2019, the entirety of all of these applications are hereby incorporated by reference into the present application.

BACKGROUND

Technical Field

The present disclosure relates to a light emitting display apparatus, and more particularly, to a light emitting display apparatus with improved light extraction efficiency.

Discussion of the Related Art

As our society advances toward an information-oriented society, the field of display apparatus for visually expressing an electrical information signal has rapidly advanced. Accordingly, various display apparatuses, having excellent performance in terms of thinness, lightness, and low power consumption, are being developed correspondingly.

Among various display apparatuses, a light emitting display apparatus is a self-light emitting display apparatus and does not need a separate light source, unlike a liquid crystal display apparatus. Thus, the light emitting display apparatus can be manufactured to have lightness and thinness.

Further, the light emitting display apparatus is advantageous in terms of power consumption since it is driven with a low voltage. Also, the light emitting display apparatus has excellent color expression ability, a high response speed, a wide viewing angle, and a high contrast ratio (CR). Therefore, the light emitting display apparatus is expected to be applied to various fields.

SUMMARY

Light emitted from an emission layer of a general light emitting display apparatus passes through various components of the light emitting display apparatus and comes out of the light emitting display apparatus. However, some of the light emitted from the emission layer cannot be extracted to the outside of the light emitting display apparatus but can be trapped in the light emitting display apparatus. Therefore, the light extraction efficiency of the general light emitting display apparatus can become a problem.

For example, there is a limitation in that some of the light emitted from the emission layer can be confined in the general light emitting display apparatus due to a total reflection loss, a waveguide loss, and a surface plasmon loss. Here, the total reflection loss refers to degradation of light extraction efficiency due to the light confined in the light emitting display apparatus by total reflection at an interface between a substrate and air, among the light emitted from the emission layer. The waveguide loss refers to degradation of light extraction efficiency due to the light confined in the light emitting display apparatus by total reflection at an interface of components in the light emitting display apparatus. The surface plasmon loss refers to degradation of light extraction efficiency occurring when light vibrates free electrons of a metal surface and thus may not be reflected or transmitted due to absorption of the light onto the metal surface while the light is incident and propagates.

To address these and other limitations and disadvantages associated with the general light emitting display apparatuses, the inventors of the present disclosure invented a light emitting display apparatus having a new and improved structure to reduce the total reflection loss and the waveguide loss and enhance the light extraction efficiency. For example, the inventors of the present disclosure formed an insulating layer including a base portion having an even upper surface and a protrusion portion protruding from the upper surface of the base portion. Then, the inventors of the present disclosure placed an anode having a reflective layer on the side of the base portion and protrusion portion. Therefore, the reflective layer of the anode formed on the side of the protrusion portion functioned as a side mirror. Also, some of light confined in the light emitting display apparatus due to total reflection was extracted in a direction toward a front surface of the light emitting display apparatus. Accordingly, the light extraction efficiency of the light emitting display apparatus is improved.

On the other hand, the inventors of the present disclosure have recognized a limitation that even when some of the above-described light emitting display apparatuses is used, light still may be lost in the form of a waveguide loss.

For example, some of the light emitted from the emission layer may be total-reflected and confined in a region formed by the emission layer between a bank layer and an organic encapsulation layer, a cathode, and an inorganic encapsulation layer. A material of the bank layer has a refractive index of about 1.6 and an organic material of the emission layer has a refractive index of from about 1.8 to about 1.9. An inorganic material of the first encapsulation layer has a refractive index of about 1.8 and an organic material of the organic encapsulation layer has a refractive index of from about 1.5 to about 1.6. Further, a metal material of the cathode has a refractive index of about 0.13. However, in a light emitting display apparatus of top emission type, the cathode is formed to have a very small thickness and thus is substantially almost transparent. Therefore, the refractive index of the cathode may not greatly affect total reflection. As such, the cathode may be ignored and the emission layer has a similar refractive index to the inorganic encapsulation layer. Accordingly, total reflection may occur at an interface between the emission layer and the bank layer and an interface between the inorganic encapsulation layer and a foreign material cover layer.

Also, some of light confined by the total reflection at the interface between the emission layer and the bank layer and the interface between the inorganic encapsulation layer and the foreign material cover layer may be emitted to the outside from a region where the bank layer becomes even. The emitted light may be total-reflected again into the light emitting display apparatus at an interface between the light emitting display apparatus and air and trapped in the light emitting display apparatus.

Accordingly, the inventors of the present disclosure invented an improved light emitting display apparatus having a new structure capable of enhancing the light extraction efficiency for light lost in the form of a total reflection loss and a waveguide loss.

Accordingly, the inventors of the present disclosure invented an improved light emitting display apparatus having a new structure capable of enhancing the light extraction efficiency for light lost in the form of a waveguide loss.

An aspect of the present disclosure is to provide a light emitting display apparatus capable of enhancing the light extraction efficiency by using an anode having a curved shape.

Another aspect of the present disclosure is to provide a light emitting display apparatus capable of improving the reliability of a cathode and a light emitting element by forming a bank layer of an inorganic material.

Another aspect of the present disclosure is to provide a light emitting display apparatus capable of minimizing light to be lost in the form of a waveguide loss even though an anode having a side mirror shape is used.

Another aspect of the present disclosure is to provide a light emitting display apparatus capable of enhancing the light extraction efficiency and front surface efficiency and thus improving power consumption.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an aspect of the present disclosure, a light emitting display apparatus includes a substrate and an insulating layer on the substrate and including a base portion and a protrusion portion, the protrusion portion having an uneven portion at a part of the base portion. The light emitting display apparatus further includes a first electrode configured to cover an upper portion of the base portion and a side portion and an upper portion of the protrusion portion and disposed along a shape of the uneven portion of the insulating layer. The light emitting display apparatus includes a bank layer configured to cover a part of the insulating layer and a part of the first electrode. The light emitting display apparatus further includes an emission layer on the first electrode and the bank layer and a second electrode on the emission layer.

According to another aspect of the present disclosure, a light emitting display apparatus includes a substrate and an overcoating layer on the substrate and including a base portion and a protrusion portion. The light emitting display apparatus further includes a light emitting element on the overcoating layer and including a first electrode, an emission layer and a second electrode. The light emitting display apparatus includes a bank layer between the first electrode and the emission layer and configured to define an emission area and an encapsulation part on the light emitting element. The light emitting display apparatus also includes a light extraction pattern on the surface of the protrusion portion of the overcoating layer and configured to change a traveling direction of light emitted from the emission layer and improve a light extraction efficiency and a front surface efficiency.

According to another aspect of the present disclosure, a light emitting display apparatus includes a substrate and an insulating layer on the substrate and including a base portion and a protrusion portion in a part of the base portion. An upper surface of the protrusion portion includes a first area and a second area between the first areas. The light emitting display apparatus further includes a first electrode in the first area and the second area. The light emitting display apparatus includes a bank layer in a part of the second area other than an interface between the first electrode and an emission layer. The light emitting display apparatus includes an emission layer on the first electrode and the bank layer and a second electrode on the emission layer.

According to another aspect of the present disclosure, a light emitting display apparatus includes an overcoating layer on a substrate and including a base portion and a protrusion portion. The protrusion portion includes an uneven portion at a part of the base portion. The light emitting display apparatus further includes a first electrode including a reflective layer on the overcoating layer and a transparent conductive layer on the reflective layer. The light emitting display apparatus includes a bank layer configured to cover a part of the overcoating layer and a part of the first electrode. The light emitting display apparatus includes an emission layer on the first electrode and the bank layer and a second electrode on the emission layer. A distance between the reflective layer of the first electrode and the second electrode is configured to adjust to implement a constructive interference for light emitted from the emission layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, it is possible to enhance the light extraction efficiency of a light emitting display apparatus by using an anode having a side mirror shape.

According to an embodiment of the present disclosure, it is possible to reduce light lost in the form of a waveguide loss among light emitting from an emission layer and thus increase the light extraction efficiency.

According to an embodiment of the present disclosure, it is possible to improve the light extraction efficiency of a light emitting display apparatus by forming a bank layer of an inorganic material and enhance the reliability thereof.

According to an embodiment of the present disclosure, it is possible to enhance the light extraction efficiency and front surface efficiency and thus implement a light emitting display apparatus with improved power consumption.

According to an embodiment of the present disclosure, it is possible to increase the light extraction efficiency of a light emitting display apparatus by forming a bank layer of an organic material and separating a first electrode and the bank layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
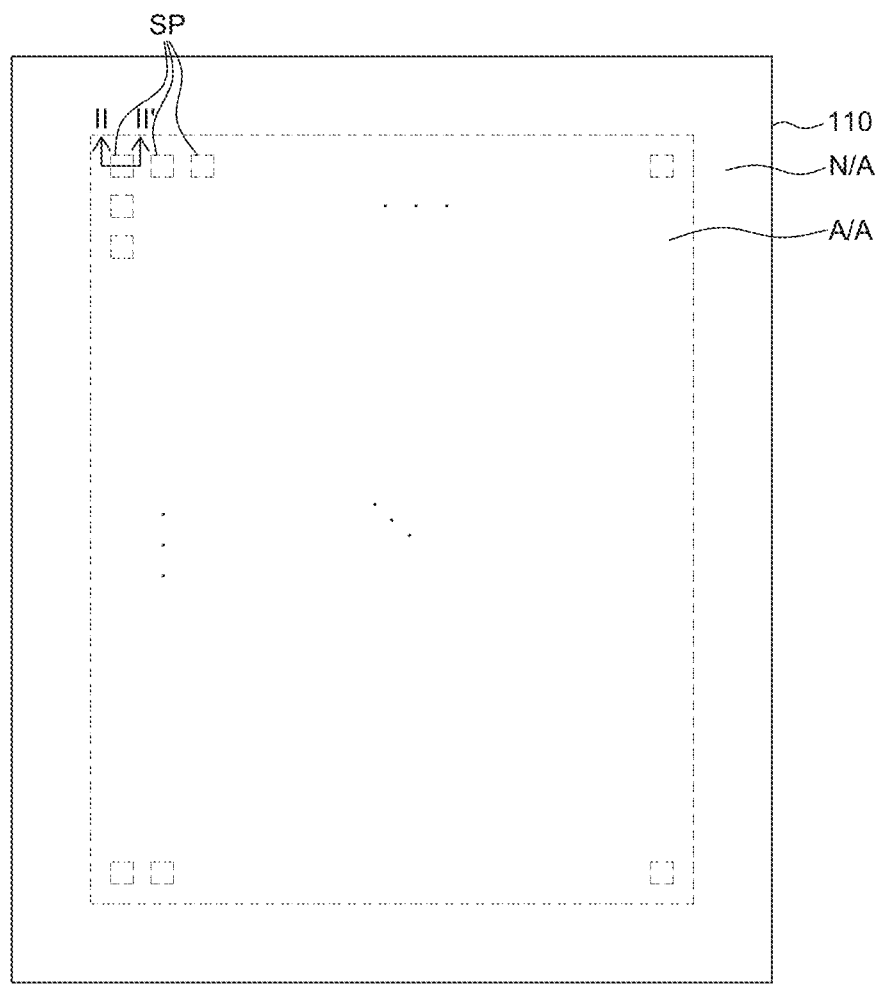
FIG. 1 illustrates a plan view of a light emitting display apparatus according to an exemplary embodiment of the present disclosure.

Advantages and characteristics of the present disclosure and method(s) of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

Although the terms "first", "second", and the like are used for describing various components, these components are not confined by these terms and these terms do not necessarily define any order associated with these components. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

Figure 2:
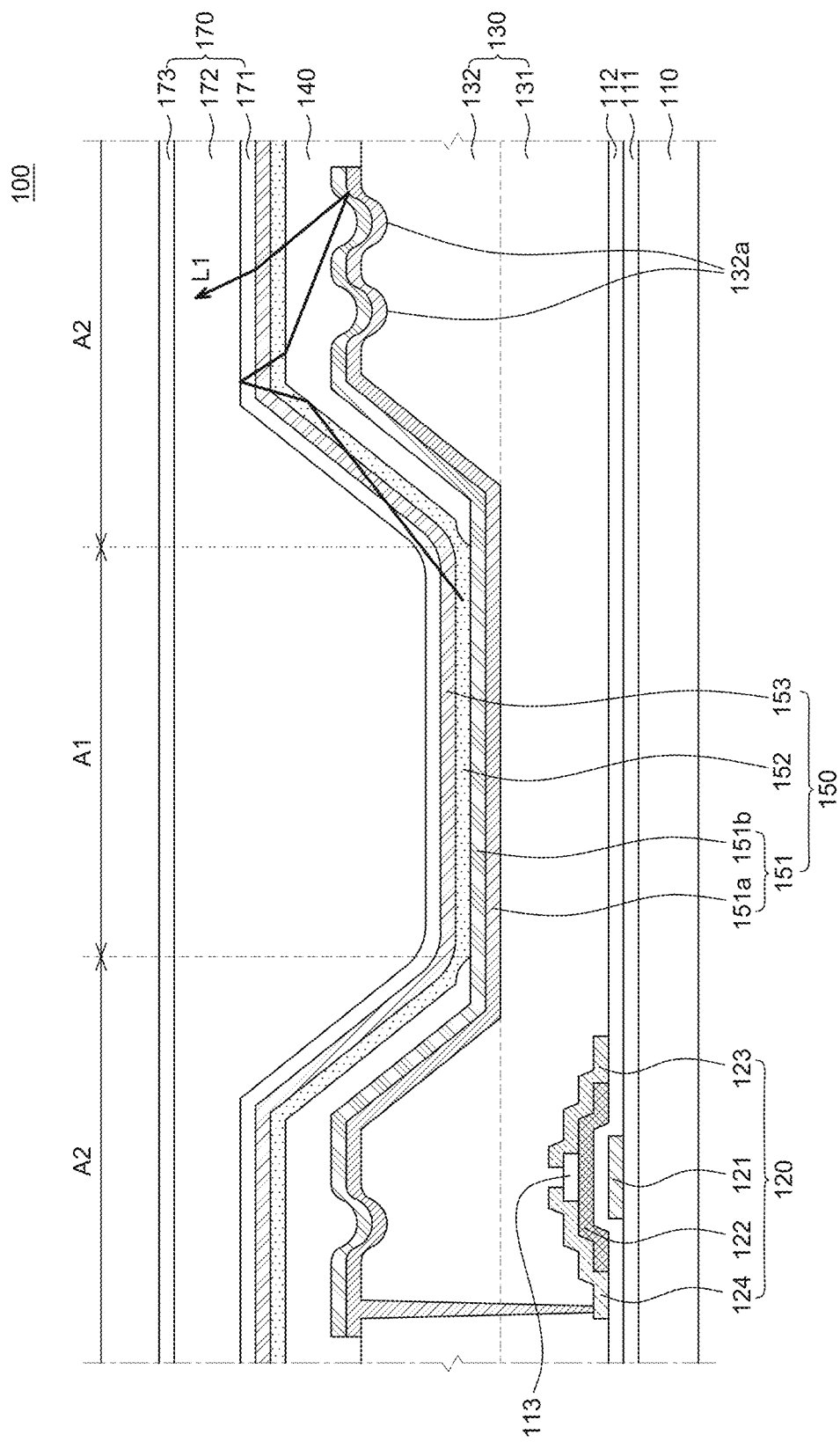
FIG. 2 is a cross-sectional view of the light emitting display apparatus shown in FIG. 1 as taken along a line II-II'.

FIG. 1 is a plan view of a light emitting display apparatus according to an exemplary embodiment of the present disclosure. FIG. 2 is a cross-sectional view of the light emitting display apparatus shown in FIG. 1 as taken along a line II-II'. All components of the light emitting display apparatus according to all embodiments of the present disclosure are operatively coupled and configured.

With reference to FIG. 1 and FIG. 2, a light emitting display apparatus 100 can include a substrate 110, a thin film transistor 120, a light emitting element 150 and an encapsulation part 170. The light emitting display apparatus 100 is implemented as a top emission type light emitting display apparatus, but other types are part of the present disclosure.

With reference to FIG. 1 and FIG. 2, the substrate 110 serves to support and protect various components of the light emitting display apparatus 100. The substrate 110 can be formed of glass or a plastic material having flexibility. If the substrate 110 is formed of plastic material, it can be formed of, e.g., polyimide (PI), but is not limited thereto.

The substrate 110 includes an active area or display area A/A and a non-active area or non-display area N/A.

The display area A/A is a region of the light emitting display apparatus 100 in which images are displayed. In the display area A/A, a display element and various driving elements for driving the display element can be disposed. For example, the display element can be configured as the light emitting element 150 including a first electrode 151, an emission layer 152 and a second electrode 153. Further, various driving elements, such as a thin film transistor 120, a capacitor, a line, etc., for driving the display element can be disposed in the active area A/A.

The display area A/A can include a plurality of sub-pixels SP. The sub-pixel SP is a minimum unit for configuring a screen. Each of the plurality of sub-pixels SP can include the light emitting element 150 and a driving circuit. Further, the plurality of sub-pixels SP can emit light with different wavelengths. For example, the plurality of sub-pixels SP can include a red sub-pixel, a green sub-pixel, and a blue sub-pixel, but is not limited thereto. The plurality of sub-pixels SP can further include a white sub-pixel.

The driving circuit of the sub-pixel SP is configured to control driving of the light emitting element 150. For example, the driving circuit can include the thin film transistor 120 and a capacitor, but is not limited thereto.

The non-display area N/A is a region in which images are not displayed. In the non-display area N/A, various components for driving the plurality of sub-pixels SP disposed in the display area A/A can be disposed. For example, a driving IC configured to supply a signal for driving the plurality of sub-pixels SP, a flexible film, etc. can be disposed in the non-display area N/A.

The non-display area N/A can be a region surrounding the display area A/A as shown in FIG. 1, but is not limited thereto. For example, the non-display area N/A can be a region extended from the active area A/A.

With reference to FIG. 2, a buffer layer 111 is disposed on the substrate 110. The buffer layer 111 can serve to enhance adhesion between the substrate 110 and layers formed on the buffer layer 111 and block alkali elements discharged from the substrate 110. The buffer layer 111 can be formed of a single layer of silicon nitride (SiNx) or silicon oxide (SiOx) or a multilayer of silicon nitride (SiNx) or silicon oxide (SiOx), but is not limited thereto. The buffer layer 111 is not an essential component and can be omitted depending on the kind and material of the substrate 110 and the structure and type of the thin film transistor 120.

With reference to FIG. 2, the thin film transistor 120 can be used as a driving element of the light emitting display apparatus 100. The thin film transistor 120 includes a gate electrode 121, an active layer 122, a source electrode 123 and a drain electrode 124. The thin film transistor 120 in the light emitting display apparatus 100 according to an exemplary embodiment of the present disclosure has a bottom gate structure but is not limited thereto. In the bottom gate structure, the active layer 122 is disposed on the gate electrode 121 and the source electrode 123 and the drain electrode 124 are disposed on the active layer 122.

With reference to FIG. 2, the gate electrode 121 of the thin film transistor 120 is disposed on the substrate 110. The gate electrode 121 can be formed of any one of various metal materials such as molybdenum (Mo), aluminum (Al), chromium (Cr), gold (Au), titanium (Ti), nickel (Ni), neodymium (Nd) and copper (Cu) or an alloy of two or more of them, or a multilayer thereof. However, a material of the gate electrode 121 is not limited thereto.

A gate insulating layer 112 is disposed on the gate electrode 121. The gate insulating layer 112 is configured to electrically insulate the gate electrode 121 and the active layer 122 and can be formed of an insulating material. For example, the gate insulating layer 112 can be formed of a single layer of an inorganic material such as silicon nitride (SiNx) or silicon oxide (SiOx) or a multilayer of silicon nitride (SiNx) or silicon oxide (SiOx). However, a material of the gate insulating layer 112 is not limited thereto.

The active layer 122 is disposed on the gate insulating layer 112. The active layer 122 is disposed to overlap the gate electrode 121. For example, the active layer can be formed of an oxide semiconductor or can be formed of amorphous silicon (a-Si), polycrystalline silicon (poly-Si) or an organic semiconductor.

An etch stopper 113 can be disposed on the active layer 122. When the source electrode 123 and the drain electrode 124 are formed by etching and patterning, the etch stopper 113 can serve to suppress damage to the surface of the active layer 122 caused by plasma. One portion of the etch stopper 113 can overlap the source electrode 123 and the other portion of the etch stopper 113 can overlap the drain electrode 124. Otherwise, the etch stopper 113 can be omitted.

The source electrode 123 and the drain electrode 124 are disposed on the active layer 122 and the etch stopper 113. The source electrode 123 and the drain electrode 124 are spaced apart from each other on the same layer. The source electrode 123 and the drain electrode 124 can be electrically connected to the active layer 122 to be in contact with the active layer 122. The source electrode 123 and the drain electrode 124 can be formed of any one of various metal materials such as molybdenum (Mo), aluminum (Al), chromium (Cr), gold (Au), titanium (Ti), nickel (Ni), neodymium (Nd) and copper (Cu) or an alloy of two or more of them, or a multilayer thereof. However, a material of the source electrode 123 and the drain electrode 124 are not limited thereto.

An overcoating layer 130 is disposed on the thin film transistor 120. The overcoating layer 130 protects the thin film transistor 120 and reduces a step difference between layers disposed on the substrate 110. The overcoating layer 130 can be formed of one of acrylic resin, epoxy resin, phenol resin, polyamide-based resin, polyimide-based resin, unsaturated polyester-based resin, polyphenylene-based resin, polyphenylene sulfide-based resin, benzocyclobutene and photoresist. However, a material of the overcoating layer 130 is not limited thereto.

The overcoating layer 130 includes a base portion 131 and a protrusion portion 132. The base portion 131 and the protrusion portion 132 can be formed as one body as illustrated in FIG. 2. For example, the base portion 131 and the protrusion portion 132 can be formed of the same material by the same process, such as a mask process, at the same time, but is not limited thereto.

The base portion 131 is disposed on the thin film transistor 120. An upper surface of the base portion 131 includes a parallel surface with the substrate 110. Thus, the base portion 131 can protect the thin film transistor 120 and flatten a step between layers disposed on the substrate 110.

The protrusion portion 132 is disposed on the base portion 131. The protrusion portion 132 is formed as one body with the base portion 131 and has a shape that protrudes from the base portion 131. Thus, an upper surface of the protrusion portion 132 can be smaller than a lower surface, but is not limited thereto.

The protrusion portion 132 has the upper surface and a side surface. The upper surface of the protrusion portion 132 is the uppermost surface of the protrusion portion 132 and can be substantially parallel with the base portion 131 or the substrate 110. The side surface of the protrusion portion 132 can be a surface that connects the upper surface of the protrusion portion 132 and the base portion 131. The side surface of the protrusion portion 132 can have a slanted shape that slanted from the upper surface of the protrusion portion 132 toward the base portion 131.

FIG. 2 illustrates an example of the overcoating layer 130 that includes the base portion 131 having an even upper surface and the protrusion portion 132 protruding from the base portion 131. However, as long as the overcoating layer 130 has a structure formed by the base portion 131 and the protrusion portion 132, detailed components of the overcoating layer 130 are not limited to the base portion 131 and the protrusion portion 132 and can be defined in various ways.

The protrusion portion 132 includes an uneven portion 132a. The uneven portion 132a can be disposed on a part of the upper surface of the protrusion portion 132. The uneven portion 132a can improve the light extraction efficiency and front surface efficiency of light emitted from the emission layer 152 and thus can also be referred to as a light extraction pattern. With reference to FIG. 2, the uneven portion 132a is formed into a concave groove and thus can have an oval-shaped cross-section, but is not limited thereto. For example, the cross-section of the uneven portion 132a can have one of various concave or convex shapes such as a triangular shape, a circular shape and a trapezoidal shape.

The uneven portion 132a can be disposed in the form of a plurality of dots or a line when viewed from the plane surface. For example, the uneven portion 132a can have a line shape surrounding a first area A1 at a plane surface or can have a plurality of dots disposed to surround the first area A1 at a plane surface. FIG. 2 illustrates that one uneven portion 132a is disposed on the left of the first area A1 and two uneven portions 132a are disposed on the right of the first area A1. However, the number of lines and dots of the uneven portion 132a is not limited thereto and can vary based on the design.

The uneven portion 132a can be disposed at a distance of 2 μm to 3 μm from an end portion of the upper surface connected to the side surface of the protrusion portion 132. Thus, the uneven portion 132a can easily change a traveling direction of light guided to the outside of a side mirror structure. Also, the depth from the upper surface of the protrusion portion 132 to the deepest point of the uneven portion 132a can be from 1.5 μm to 2 μm, but is not limited thereto. The uneven portion 132a can easily change a traveling direction of light incident into the uneven portion 132a.

With reference to FIG. 2, the light emitting element 150 is disposed on the overcoating layer 130. The light emitting element 150 includes the first electrode 151 disposed on the overcoating layer 130, the emission layer 152 disposed on the first electrode 151 and the second electrode 153 disposed on the emission layer 152.

The first electrode 151 is disposed on the overcoating layer 130 and can cover a side portion and an upper portion of the base portion 131 and the protrusion portion 132. For example, the first electrode 151 is disposed on a partial area of the upper surface of the base portion 131 where the protrusion portion 132 is not disposed and the side surface and the upper surface of the protrusion 132. Also, the first electrode 151 is disposed along the shape of the base portion 131 and the protrusion portion 132.

The first electrode 151 includes a reflective layer 151a electrically connected to the thin film transistor 120 and a transparent conductive layer 151b disposed on the reflective layer 151a.

The reflective layer 151a of the first electrode 151 is disposed on the overcoating layer 130. The light emitting display apparatus 100 according to an exemplary embodiment of the present disclosure is a top emission type light emitting display apparatus. Thus, the reflective layer 151a functions to reflect light emitted from the light emitting element 150 upwards. The light generated from the emission layer 152 of the light emitting element 150 is emitted not only upwards but also sideways. The light emitted sideways can travel into the light emitting display apparatus 100 and can be trapped in the light emitting display apparatus 100 by total reflection. Further, the light emitted sideways can travel into the light emitting display apparatus 100 and become extinct. Thus, the reflective layer 151a can be disposed under the emission layer 152 and covers a side portion of the protrusion portion 132 to change a traveling direction of the light traveling to the side portion of the emission layer 152 toward a front surface.

The reflective layer 151a can be formed of a metal material. For example, the reflective layer 151a can be formed of a metal material such as aluminum (Al), silver (Ag), copper (Cu) and magnesium silver alloy (Mg:Ag), but is not limited thereto. The reflective layer 151a can be electrically connected to the drain electrode 124 through a contact hole in the overcoating layer 130, but is not limited thereto. The reflective layer 151a can be electrically connected to the source electrode 123 through a contact hole in the overcoating layer 130.

The reflective layer 151a can be disposed along the shape of the uneven portion 132a of the protrusion portion 132 and can have a curved upper surface on the upper surface of the protrusion portion 132. Thus, the reflective layer 151a can have an even or flat upper surface on the upper surface of the base portion 131 of the overcoating layer 130 and a curved upper surface on the upper surface of the protrusion portion 132. Also, the reflective layer 151a can have a slanted upper surface on the side surface of the protrusion portion 132.

The transparent conductive layer 151b is disposed on the reflective layer 151a. The transparent conductive layer 151b is disposed on the reflective layer 151a and electrically connected with the drain electrode 124 through the reflective layer 151a. The transparent conductive layer 151b can be formed of a conductive material having a high work function to supply holes to the emission layer 152. For example, the transparent conductive layer 151b can be formed of indium tin oxide (ITO), indium zinc oxide (IZO), indium tin zinc oxide (ITZO), zinc oxide (ZnO), and tin oxide (TO)-based transparent conductive oxides. However, a material of the transparent conductive layer 151b is not limited thereto.

The transparent conductive layer 151b can be disposed along the shape of the uneven portion 132a of the protrusion portion 132 and can have a curved upper surface on the upper surface of the protrusion portion 132. Thus, the transparent conductive layer 151b can have an even upper surface on the upper surface of the base portion 131 of the overcoating layer 130 and a curved upper surface on the upper surface of the protrusion portion 132. Also, the transparent conductive layer 151b can have a slanted upper surface on the side surface of the protrusion portion 132. For example, the transparent conductive layer 151b can be formed along the shape of the reflective layer 151a.

With reference to FIG. 2, a bank layer 140 is disposed on the first electrode 151 and the overcoating layer 130. The bank layer 140 covers a part of the first electrode 151 in the light emitting element 150 and can include a first area A1 that is an emission area and a second area A2 that is a non-emission area. For example, the bank layer 140 in the second area A2 can be disposed between the first electrode 151 and the emission layer 152 to block the generation of light from the second area A2. Since the bank layer 140 is not disposed in the first area A1, the emission layer 152 can be disposed right on the first electrode 151 and light can be generated from the emission layer 152.

The bank layer 140 can be formed of an organic material. For example, the bank layer 140 can be formed of polyimide, acryl-based or benzocyclobutene-based resin, but is not limited thereto. If the bank layer 140 is formed of an organic material, the bank layer 140 can have a refractive index of about 1.6.

Since the bank layer 140 is formed of an organic material, the bank layer 140 can be disposed to fill or cover the curved upper surface of the first electrode 151. Thus, the bank layer 140 on the protrusion portion 132 can flatten or planarize an upper portion of the protrusion portion 132 and can be evener than the upper surface of the protrusion portion 132.

The emission layer 152 is disposed on the first electrode 151. For example, the emission layer 152 is disposed on the first electrode 151 in the first area A1 that is an emission area and disposed on the bank layer 140 in the second area A2 that is a non-emission area.

The emission layer 152 is configured to emit light of a specific color and can include at least one of a red emission layer, a green emission layer, a blue emission layer and a white emission layer. Further, the emission layer 152 can include various layers such as a hole transport layer, a hole injection layer, a hole blocking layer, an electron injection layer, an electron blocking layer and an electron transport layer. The refractive index of the emission layer 152 can vary depending on the kind of organic material forming the emission layer 152. An organic material that can be used as the emission layer 152 can have a refractive index of from about 1.8 to about 1.9 on average. The emission layer 152 can be an organic emission layer formed of an organic material, but is not limited thereto. For example, the emission layer 152 can be a quantum dot emission layer or a micro LED.

Since the emission layer 152 is disposed on the first electrode 151 and the bank layer 140 at the second area A2, the emission layer 152 can also be disposed along the shape of an upper surface of the bank layer 140. Thus, the emission layer 152 can have an even or flat upper surface on the upper surfaces of the protrusion portion 132 and the base portion 131 and a slanted upper surface on the side surface of the protrusion portion 132.

The second electrode 153 is disposed on the emission layer 152. The second electrode 153 supplies electrons to the emission layer 152. The second electrode 153 can be formed of indium tin oxide (ITO), indium zinc oxide (IZO), indium tin zinc oxide (ITZO), zinc oxide (ZnO), and tin oxide (TO) based transparent conductive oxides or ytterbium (Yb) alloy. If the second electrode 153 is formed of a transparent conductive oxide such as indium tin oxide (ITO), the second electrode 153 can have a refractive index of from about 1.8 to about 1.9. Further, the second electrode 153 can be formed of a metal material such as silver (Ag), copper (Cu) and magnesium silver alloy (Mg:Ag) or a very thin metal material, but is not limited thereto. If the second electrode 153 is formed of a metal material, it can have a very low refractive index. For example, if silver (Ag) is used as the second electrode 153, the second electrode 153 can have a refractive index of about 0.13. Since the light emitting display apparatus 100 is a top emission type light emitting display apparatus, the second electrode 153 has a very small thickness. Therefore, the refractive index of the second electrode 153 may not affect the travel of light.

Since the second electrode 153 is disposed on the emission layer 152 in the second area A2, the second electrode 153 can also be disposed along the shape of the upper surface of the bank layer 140. Thus, the second electrode 153 can have an even or flat upper surface on the upper surfaces of the protrusion portion 132 and the base portion 131 and a slanted upper surface on the side surface of the protrusion portion 132.

With reference to FIG. 2, the encapsulation part 170 is disposed on the light emitting element 150. The encapsulation part 170 can be disposed to cover the second electrode 153. The encapsulation part 170 can protect the emission layer 152 against moisture or oxygen permeating from the outside of the light emitting display apparatus 100.

The encapsulation part 170 includes a first encapsulation layer 171, a second encapsulation layer 172, and a third encapsulation layer 173.

The first encapsulation layer 171 can be disposed on the second electrode 153 and can suppress the permeation of moisture or oxygen. The first encapsulation layer 171 can be formed of an inorganic material such as silicon nitride (SiNx), silicon oxynitride (SiNxOy) or aluminum oxide (AlyOz), but is not limited thereto. The first encapsulation layer 171 can be formed of a material having a higher refractive index than the second encapsulation layer 172. For example, if the first encapsulation layer 171 is formed of silicon nitride (SiNx) or silicon oxynitride (SiNxOy), the first encapsulation layer 171 can have a refractive index of about 1.8.

The second encapsulation layer 172 can be disposed on the first encapsulation layer 171 to flatten or planarize the surface of the first encapsulation layer 171. Further, the second encapsulation layer 172 can cover foreign materials or particles which can be generated during a manufacturing process. The second encapsulation layer 172 can be formed of an organic material such as silicon oxycarbon (SiOxCz)-, acryl-based or epoxy-based resin, but is not limited thereto. The second encapsulation layer 172 can be formed of a material having a lower refractive index than the first encapsulation layer 171. For example, when the second encapsulation layer 172 is formed of acryl-based resin, the second encapsulation layer 172 can have a refractive index of from about 1.5 to about 1.6.

The third encapsulation layer 173 can be disposed on the second encapsulation layer 172 and can suppress the permeation of moisture or oxygen like the first encapsulation layer 171. The third encapsulation layer 173 can be formed of an inorganic material such as silicon nitride (SiNx), silicon oxynitride (SiNxOy), silicon oxide (SiOx) or aluminum oxide (AlyOz), but is not limited thereto. The third encapsulation layer 173 can be formed of the same material as or a different material from the first encapsulation layer 171.

Since the light emitting display apparatus 100 according to an exemplary embodiment of the present disclosure is a top emission type light emitting display apparatus, it can be manufactured to implement micro cavity. For example, in the light emitting display apparatus 100 according to an exemplary embodiment of the present disclosure, the distance between the reflective layer 151a of the first electrode 151 and the second electrode 153 is set to implement a constructive interference for light emitted from the emission layer 152. Therefore, it is possible to enhance the light efficiency.

In a related art light emitting display apparatus, some of light emitted from an emission layer is confined and lost in the light emitting display apparatus, which causes a decrease in light efficiency. For example, some of light emitted from the emission layer cannot be extracted to the outside of the light emitting display apparatus due to a total reflection loss or a waveguide loss. Therefore, the light extraction efficiency of the light emitting display apparatus decreases. For example, the related art light emitting display apparatus uses a first electrode formed on an overcoating layer having an even upper surface. Therefore, light output at a small output angle among the light emitted from the emission layer can be trapped in the light emitting display apparatus due to a total reflection loss or a waveguide loss.

However, the light emitting display apparatus 100 according to an exemplary embodiment of the present disclosure uses the overcoating layer 130 having the protrusion portion 132 and thus can enhance the light extraction efficiency of the light emitting element 150. For example, in the light emitting display apparatus 100 according to an exemplary embodiment of the present disclosure, the overcoating layer 130 includes the base portion 131 and the protrusion portion 132 protruding from the base portion 131. Further, the reflective layer 151a of the first electrode 151 in the light emitting element 150 is disposed to cover the base portion 131 and at least the side surface of the protrusion portion 132. Therefore, light output at a small output angle among light emitted from the emission layer 152 of the light emitting display apparatus 100 can be extracted in a direction toward the front surface by the reflective layer 151a of the first electrode 151 disposed on the side portion of the protrusion portion 132. For example, if a first electrode is disposed on an even overcoating layer, light traveling in a direction toward a side surface, e.g., light output at a small output angle, may not travel to the direction toward the front surface. Also, the light may not be extracted to the outside of the light emitting display apparatus due to a total reflection loss or a waveguide loss.

However, in the light emitting display apparatus 100 according to an exemplary embodiment of the present disclosure, light output at a small output angle from the emission layer 152 can be reflected by the reflective layer 151a of the first electrode 151 disposed on the side portion of the protrusion portion 132. Then, the light can be extracted in the direction toward the front surface. Therefore, in the light emitting display apparatus 100 according to an exemplary embodiment of the present disclosure, the reflective layer 151a of the first electrode 151 disposed on a side portion of the overcoating layer 130 functions as a side mirror. Thus, the reflective layer 151a of the first electrode 151 can extract light, which can be lost in the light emitting display apparatus 100, in the direction toward the front surface. Accordingly, the light extraction efficiency can be increased and the power consumption can be improved.

Further, in the light emitting display apparatus 100 according to an exemplary embodiment of the present disclosure, the uneven portion 132a is disposed on the upper surface of the protrusion portion 132 of the overcoating layer 130. Thus, the uneven portion 132a can adjust a traveling direction of light confined or trapped between the bank layer 140 and the second encapsulation layer 172 by total reflection. Thus, the uneven portion 132a can increase the light extraction efficiency of the light emitting display apparatus 100. For example, some of light emitted from the emission layer 152 can be reflected by the first electrode 151 having a side mirror structure and extracted to the outside of the light emitting display apparatus 100. However, the rest of the light emitted from the emission layer 152 can be total-reflected and confined in the light emitting display apparatus 100, e.g., between the bank layer 140 and the second encapsulation layer 172 or at an interface between the light emitting display apparatus 100 and air. Therefore, some of the total-reflected light in the light emitting display apparatus 100 can be changed in traveling direction. Thus, the light can be extracted to the outside of the light emitting display apparatus 100 by the curved reflective layer 151a of the first electrode 151. For example, a material of the bank layer 140 has a refractive index of about 1.6 and an organic material of the emission layer 152 has a refractive index of from about 1.8 to about 1.9. Also, for example, an inorganic material of the first encapsulation layer 171 has a refractive index of about 1.8 and an organic material of the second encapsulation layer 172 has a refractive index of from about 1.5 to about 1.6. Accordingly, due to a difference in refractive indexes between the first encapsulation layer 171 and the second encapsulation layer 172, a first light L1 output from the emission layer 152 is total-reflected at an interface between the first encapsulation layer 171 and the second encapsulation layer 172 and at an interface between the emission layer 152 and the bank layer 140. Therefore, the total-reflected first light L1 can be reflected one or more times at the inside of the curved surface of the reflective layer 151a of the first electrode 151 and then extracted in the direction toward the front surface.

Therefore, in the light emitting display apparatus 100 according to an exemplary embodiment of the present disclosure, the reflective layer 151a of the first electrode 151 is disposed along the uneven portion 132a of the protrusion portion 132. Also, the reflective layer 151a of the first electrode 151 changes a traveling direction of light that can be confined or trapped between the bank layer 140 and the second encapsulation layer 172. Accordingly, it is possible to increase the light extraction efficiency and front surface efficiency of the light emitting display apparatus 100. The front surface efficiency is the extraction efficiency for light extracted in the direction toward the front surface.

Figure 3:
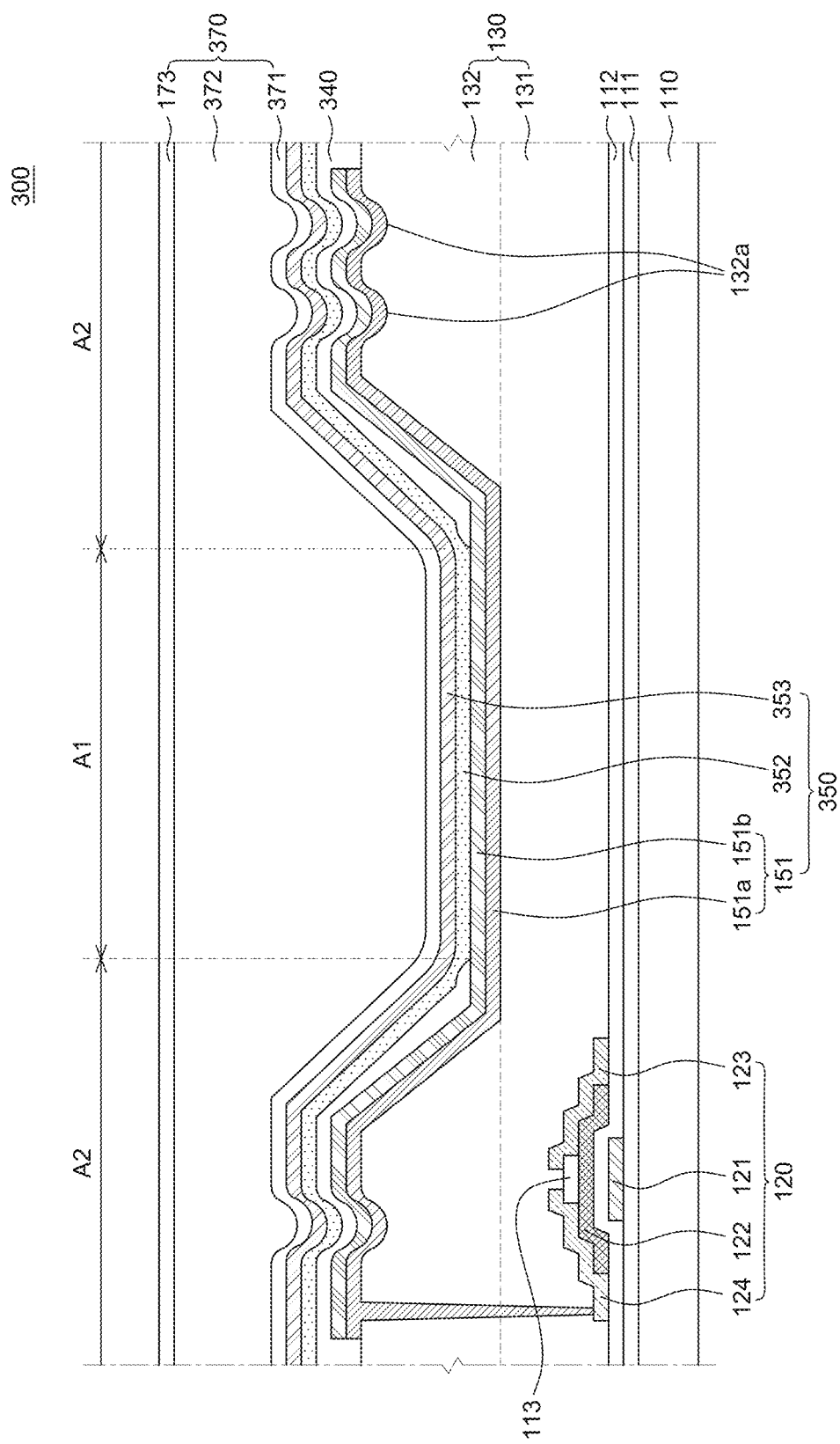
FIG. 3 is a cross-sectional view of a light emitting display apparatus according to another exemplary embodiment of the present disclosure.

FIG. 3 is a cross-sectional view of a light emitting display apparatus according to another exemplary embodiment of the present disclosure, where the cross-section is taken in a similar manner as the cross-section taken for FIG. 2. A light emitting display apparatus 300 illustrated in FIG. 3 is substantially the same as the light emitting display apparatus 100 illustrated in FIG. 1 and FIG. 2 except for a bank layer 340, an emission layer 352, a second electrode 353, a first encapsulation layer 371 and a second encapsulation layer 372. Therefore, its redundant description will be omitted or will be brief.

With reference to FIG. 3, the bank layer 340 can be formed of an inorganic material. For example, the bank layer 340 can be formed of amorphous silicon, silicon oxide, silicon nitride or silicon oxynitride, but is not limited thereto. If the bank layer 340 is formed of an inorganic material, the bank layer 340 can have a refractive index of about 1.8.

The bank layer 340 is disposed on the first electrode 151 in the second area A2. The bank layer 340 can be formed of an inorganic material and disposed along the shape of the first electrode 151 in the second area A2. Thus, the bank layer 340 can be formed of an inorganic material and can have a curved upper surface on the upper surface of the protrusion portion 132 and a slanted upper surface on the side surface of the protrusion portion 132. For example, the bank layer 340 can be formed to correspond to the shape of the first electrode 151. The bank layer 340 can have a thickness of 200 nm, but is not limited thereto.

The emission layer 352 of a light emitting element 350 is disposed on the bank layer 340. For example, the emission layer 352 can be disposed on the upper surface of the base portion 131 in the first area A1 and the upper surface and the side surface of the protrusion portion 132 in the second area A2. Thus, the emission layer 352 can have an even upper surface on the upper surface of the base portion 131, a curved upper surface on the upper surface of the protrusion portion 132 and a slanted upper surface on the side surface of the protrusion portion 132. Therefore, the emission layer 352 can be formed to correspond to the shape of the bank layer 340.

The second electrode 353 of the light emitting element 350 is disposed on the emission layer 352. For example, the second electrode 353 can be disposed on the upper surface of the base portion 131 in the first area A1 and the upper surface and the side surface of the protrusion portion 132 in the second area A2. Thus, the second electrode 353 can have an even upper surface on the upper surface of the base portion 131, a curved upper surface on the upper surface of the protrusion portion 132 and a slanted upper surface on the side surface of the protrusion portion 132. Therefore, the second electrode 353 can be formed to correspond to the shape of the emission layer 352.

The first encapsulation layer 371 of an encapsulation part 370 is disposed on the second electrode 353. For example, the first encapsulation layer 371 can be disposed on the upper surface of the base portion 131 in the first area A1 and the upper surface and the side surface of the protrusion portion 132 in the second area A2. Thus, the first encapsulation layer 371 can have an even or flat upper surface at the upper surface of the base portion 131, a curved upper surface at the upper surface of the protrusion portion 132 and a slanted upper surface at the side surface of the protrusion portion 132. Therefore, the first encapsulation layer 371 can be formed to correspond to the shape of the second electrode 353.

The second encapsulation layer 372 is disposed on the first encapsulation layer 371. The second encapsulation layer 372 can be disposed on the first encapsulation layer 371 to flatten the surface of the first encapsulation layer 371. The second encapsulation layer 372 can be disposed in the second area A2 to fill or cover a curved surface of the first encapsulation layer 371.

In the light emitting display apparatus 300 according to another exemplary embodiment of the present disclosure, the uneven portion 132a is disposed on the upper surface of the protrusion portion 132 of the overcoating layer 130. Thus, the uneven portion 132a can increase the light extraction efficiency of the light emitting display apparatus 300. For example, some of light emitted from the emission layer 352 can be reflected by the first electrode 151 having a side mirror structure and extracted to the outside of the light emitting display apparatus 300. However, the rest of the light emitted from the emission layer 352 can be total-reflected and confined or trapped in the light emitting display apparatus 300, e.g., between the second encapsulation layer 372 and the first electrode 151 or at an interface between the light emitting display apparatus 300 and air. Therefore, some of the total-reflected light in the light emitting display apparatus 300 can be changed in traveling direction so that the light can be extracted to the outside of the light emitting display apparatus 300 by the uneven reflective layer 151a of the first electrode 151. For example, a material of the bank layer 340 has a refractive index of about 1.8 and an organic material of the emission layer 352 has a refractive index of from about 1.8 to about 1.9. Also, for example, an inorganic material of the first encapsulation layer 371 has a refractive index of about 1.8 and an organic material of the second encapsulation layer 372 has a refractive index of from about 1.5 to about 1.6. Thus, the bank layer 340, the emission layer 352 and the first encapsulation layer 371 that are similar in refractive index to each other serve as a single layer. Therefore, light output from the emission layer 352 is total-reflected at an interface between the first encapsulation layer 371 and the second encapsulation layer 372. The total-reflected light can be reflected at the inside of the uneven surface of the reflective layer 151a of the first electrode 151 and then extracted in the direction toward the front surface. Therefore, in the light emitting display apparatus 300 according to another exemplary embodiment of the present disclosure, the reflective layer 151a of the first electrode 151 is disposed along the uneven portion 132a of the protrusion portion 132. Also, the reflective layer 151a of the first electrode 151 changes a traveling direction of light that can be confined or trapped between the second encapsulation layer 372 and the first electrode 151. Accordingly, it is possible to increase the light extraction efficiency of the light emitting display apparatus 300 and the extraction efficiency for light extracted in the direction toward the front surface of the light emitting display apparatus 300.

Also, in the light emitting display apparatus 300 according to another exemplary embodiment of the present disclosure, the bank layer 340 is formed of an inorganic material. Thus, it is possible to minimize light to be confined or trapped in the light emitting display apparatus 300 by total reflection. Therefore, it is possible to increase the light extraction efficiency of the light emitting display apparatus 300. For example, if the bank layer 340 is formed of an inorganic material having a refractive index of about 1.8, the bank layer 340 has a refractive index similar to those of the emission layer 352 and the first encapsulation layer 371. Thus, the amount of light to be confined or trapped between the bank layer 340 and the emission layer 352 and the first encapsulation layer 371 among light emitted from the emission layer 352 decreases. Therefore, the bank layer 340 is formed of an inorganic material and thus minimizes the amount of light to be confined or trapped in the light emitting display apparatus 300. Accordingly, it is possible to increase the light extraction efficiency of the light emitting display apparatus 300.

Further, in the light emitting display apparatus 300 according to another exemplary embodiment of the present disclosure, the bank layer 340 is formed of an inorganic material. Thus, it is possible to increase the amount of light to reach the first electrode 151 having a side mirror structure. Therefore, it is possible to increase the light extraction efficiency of the light emitting display apparatus 300. For example, if the bank layer 340 is formed of an inorganic material having a refractive index of about 1.8, light emitted from the emission layer 352 is refracted at a high angle by the bank layer 340. Thus, the bank layer 340 can increase the amount of light traveling toward the first electrode 151 having a side mirror structure. Also, the light reflected by the first electrode 151 can be extracted in the direction toward the front surface of the light emitting display apparatus 300. Therefore, the bank layer 340 is formed of an inorganic material and thus increases the amount of light to be reflected by the first electrode 151 having a side mirror structure. Accordingly, it is possible to increase the light extraction efficiency of the light emitting display apparatus 300.

Furthermore, in the light emitting display apparatus 300 according to another exemplary embodiment of the present disclosure, the bank layer 340 is formed of an inorganic material. Thus, it is possible to improve the reliability of the light emitting element 350. For example, if the bank layer 340 is formed of an inorganic material, the bank layer 340 can be disposed to have a gentle slope on the side portion of the protrusion portion 132. Thus, the second electrode 353 disposed on the bank layer 340 can also be disposed to have a gentle slope. Therefore, the bank layer 340 is formed of an inorganic material and thus suppresses a short of the second electrode 353 caused by a steep slope of the bank layer 340. Accordingly, it is possible to improve the reliability of the light emitting element 350 and the light emitting display apparatus 300.

Figure 4:
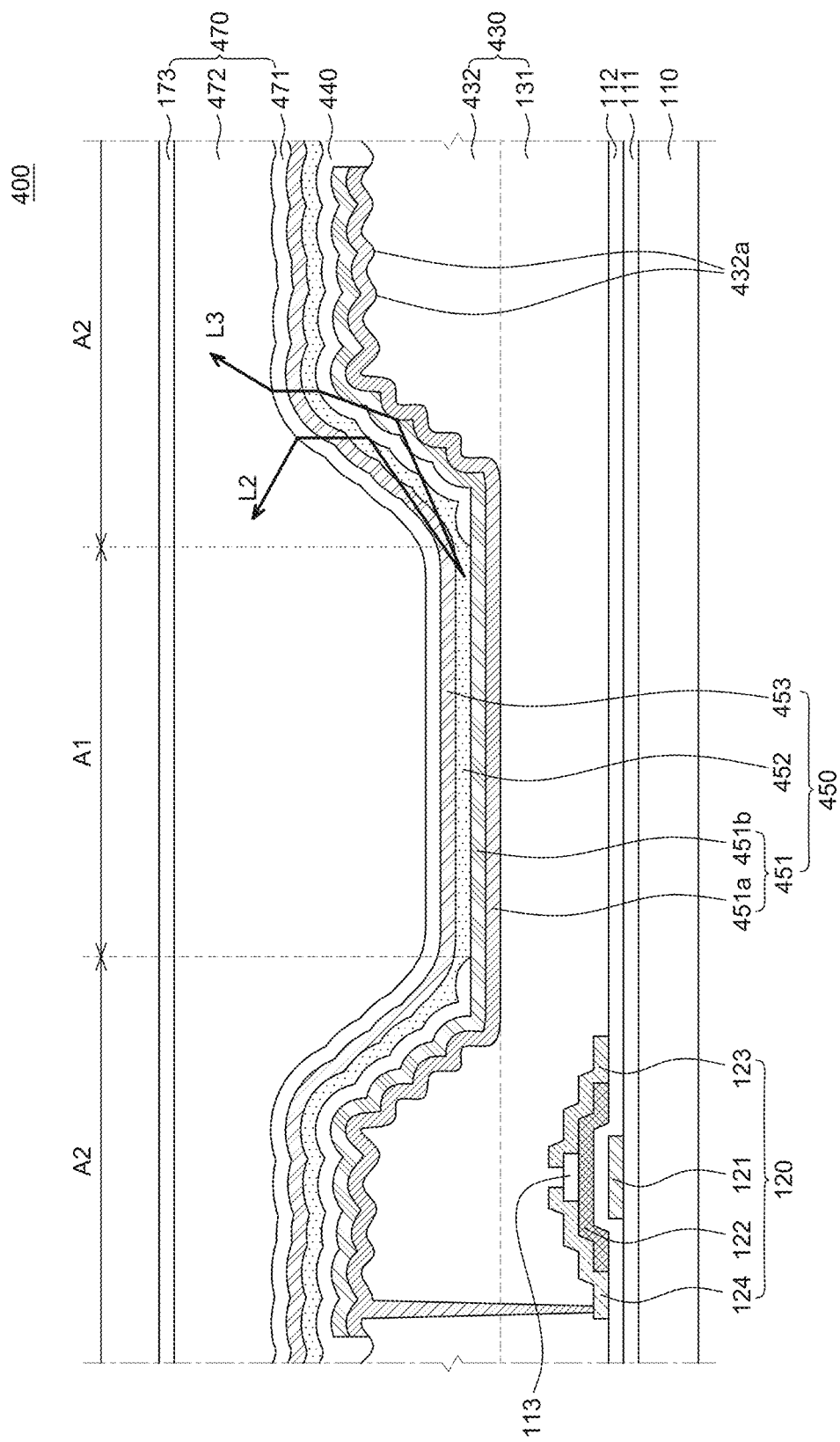
FIG. 4 is a cross-sectional view of a light emitting display apparatus according to yet another exemplary embodiment of the present disclosure.

FIG. 4 is a cross-sectional view of a light emitting display apparatus 400 according to another exemplary embodiment of the present disclosure, where the cross-section is taken in a similar manner as the cross-section taken for FIG. 2. A light emitting display apparatus 400 illustrated in FIG. 4 is substantially the same as the light emitting display apparatus 100 illustrated in FIG. 1 and FIG. 2 except for an overcoating layer 430, a bank layer 440, a light emitting element 450 and an encapsulation part 470. Therefore, its redundant description will be omitted or will be brief.

With reference to FIG. 4, a protrusion portion 432 of the overcoating layer 430 includes an uneven portion 432a. The uneven portion 432a can be disposed on a side portion and an upper surface of the protrusion portion 432.

The overcoating layer 430 including the uneven portion 432a can be formed by a coating process and can be formed by, for example, spin coating. For example, the overcoating layer 430 can be formed by spin coating and a first electrode 451 can be formed on the protrusion portion 432 of the overcoating layer 430 and then applied with heat. Then, the uneven portion 432a can be formed on the protrusion portion 432 by contraction and/or expansion resulting from a difference in thermal expansion coefficient between materials of the protrusion portion 432 and the first electrode 451. However, a manufacturing process of the uneven portion 432a is not limited thereto. The uneven portion 432a can be formed by an ashing process or a plasma process.

With reference to FIG. 4, the uneven portion 432a can have a wrinkle shape. For example, the uneven portion 432a can have an irregular wrinkle shape. As described above, the shape of the uneven portion 432a is determined by contraction and/or expansion resulting from a difference in thermal expansion coefficient. Therefore, the uneven portion 432a can have an irregular wrinkle shape, but is not limited thereto. The uneven portion 432a can have a regular wrinkle shape.

The pitch and the depth of the uneven portion 432a can be adjusted variously based on the thickness of the first electrode 451. The term "pitch" refers to the distance between peaks of the uneven portion 432a, and the term "depth" refers to the distance between the highest point and the lowest point of the uneven portion 432a. For example, if the first electrode 451 having a large thickness is disposed on the protrusion portion 432, the pitch and the depth of the uneven portion 432a can increase. For example, if the first electrode 451 having a small thickness is disposed on the protrusion portion 432, the pitch and the depth of the uneven portion 432a can decrease.

Further, the pitch and the depth of the uneven portion 432a can be adjusted based on the rotation speed (rpm) of spin coating during a manufacturing process of the overcoating layer 430. For example, if the rotation speed of spin coating increases, the thickness of the overcoating layer 430 decreases and the depth and the pitch of the uneven portion 432a decrease. On the other hand, if the rotation speed of spin coating during a manufacturing process of the overcoating layer 430 decreases, the thickness of the overcoating layer 430 increases and the depth and the pitch of the uneven portion 432a increase.

With reference to FIG. 4, the first electrode 451 is disposed on the overcoating layer 430. For example, the first electrode 451 can include a reflective layer 451a and a transparent conductive layer 451b disposed on the reflective layer 451a. Also, the reflective layer 451a and the transparent conductive layer 451b can be disposed on the overcoating layer 430 along the upper surface and the side portion of the protrusion portion 432 and the upper surface of the base portion 131. For example, the first electrode 451 can be disposed on the side portion and the upper surface of the protrusion portion 432 along the shape of the uneven portion 432a. Therefore, the first electrode 451 can have an even upper surface at the upper surface of the base portion 131 and an uneven upper surface on the upper surface and the side portion of the protrusion portion 432.

The bank layer 440 can be formed of an inorganic material. For example, the bank layer 440 can be formed of amorphous silicon, silicon oxide, silicon nitride or silicon oxynitride, but is not limited thereto.

The bank layer 440 is disposed on the first electrode 451 of the second area A2. The bank layer 440 can be formed of an inorganic material and disposed along the shape of the first electrode 451 in the second area A2. Thus, the bank layer 440 can be formed of an inorganic material and can have an uneven upper surface on the upper surface and the side portion of the protrusion portion 432. For example, the bank layer 440 can be formed to correspond to the shape of the first electrode 451. The bank layer 440 can be formed to have a thickness of 200 nm, but is not limited thereto.

An emission layer 452 is disposed on the bank layer 440. The emission layer 452 can be disposed on the upper surface of the base portion 131 and the upper surface and the side portion of the protrusion portion 432. For example, the emission layer 452 can have an uneven upper surface on the upper surface and the side portion of the protrusion portion 432. Therefore, the emission layer 452 can have an even upper surface on the upper surface of the base portion 131 and an uneven upper surface on the upper surface and the side portion of the protrusion portion 432.

A second electrode 453 is disposed on the emission layer 452. The second electrode 453 can be disposed along the upper surface of the base portion 131 and the upper surface and the side portion of the protrusion portion 432. For example, the second electrode 453 can have an uneven upper surface on the upper surface and the side portion of the protrusion portion 432. Therefore, the second electrode 453 can have an even upper surface on the upper surface of the base portion 131 and an uneven upper surface on the upper surface and the side portion of the protrusion portion 432.

A first encapsulation layer 471 is disposed on the second electrode 453. The first encapsulation layer 471 can be disposed along the upper surface of the base portion 131 and the upper surface and the side portion of the protrusion portion 432. For example, the first encapsulation layer 471 can have an uneven upper surface on the upper surface and the side portion of the protrusion portion 432. Therefore, the first encapsulation layer 471 can have an even upper surface on the upper surface of the base portion 131 and an uneven upper surface on the upper surface and the side portion of the protrusion portion 432.

A second encapsulation layer 472 is disposed on the first encapsulation layer 471. The second encapsulation layer 472 can be disposed on the first encapsulation layer 471 to flatten the surface of the first encapsulation layer 471. The second encapsulation layer 472 can be disposed in the second area A2 to fill or cover an uneven surface of the first encapsulation layer 471.

In the light emitting display apparatus 400 according to another exemplary embodiment of the present disclosure, the uneven portion 432a having a wrinkle shape is disposed on the side portion and the upper surface of the protrusion portion 432. Thus, the uneven portion 432a scatters light emitted from the emission layer 452. Therefore, it is possible to increase the light extraction efficiency of the light emitting display apparatus 400. For example, some of light emitted from the emission layer 452 can be reflected by the first electrode 451 having a side mirror structure and extracted to the outside of the light emitting display apparatus 400. However, the rest of the light emitted from the emission layer 452 can be total-reflected and confined in the light emitting display apparatus 400, e.g., between the second encapsulation layer 472 and the first electrode 451 or at an interface between the light emitting display apparatus 400 and air. Therefore, some of the total-reflected light can be scattered at the surface of the reflective layer 451a disposed on the uneven portion 432a of the protrusion portion 432 having a wrinkle shape, the surface of the transparent conductive layer 451b and the surface of a bank layer 440. Thus, a traveling direction of the light can be changed. For example, a second light L2 output from the emission layer 452 can be scattered at the surface of the bank layer 440 and a third light L3 can be scattered at the surface of the reflective layer 451a. For example, the first electrode 451 is disposed along the wrinkle shape of the uneven portion 432a of the protrusion portion 432. Thus, the reflective layer 451a, the transparent conductive layer 451b and the bank layer 440 are also disposed along the wrinkle shape. Some of the total-reflected light in the light emitting display apparatus 400 can include the second light L2 and the third light L3 and can be scattered by the reflective layer 451a, the transparent conductive layer 451b and the bank layer 440. Thus, a traveling direction of the light can be changed so that the light can be extracted to the outside of the light emitting display apparatus 400. Therefore, the first electrode 451 is disposed along the wrinkle shape of the uneven portion 432a of the protrusion portion 432 and thus scatters light confined or trapped in the light emitting display apparatus 400. Accordingly, it is possible to increase the light extraction efficiency of the light emitting display apparatus 400.

Figure 5A:
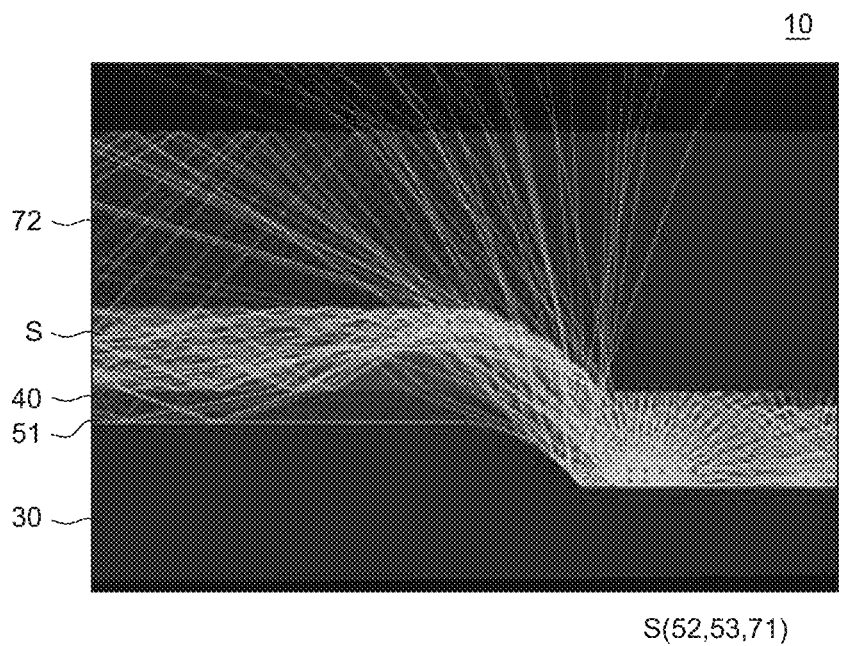
FIG. 5A and FIG. 5B illustrate examples of simulations of the light extraction efficiency of light emitting display apparatuses according to a comparative example and an exemplary embodiment of the present disclosure, respectively.
Figure 5B:
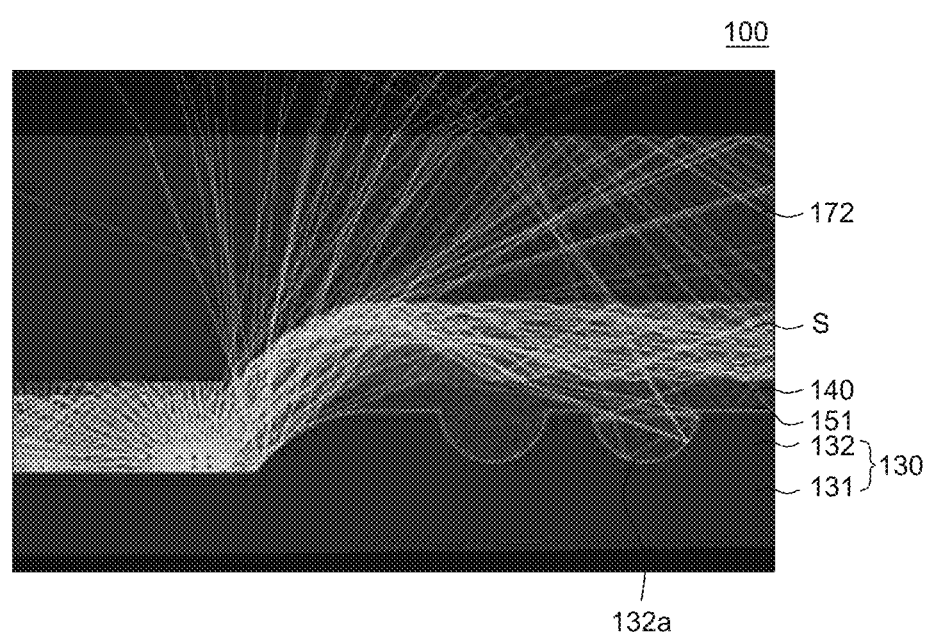

FIG. 5A and FIG. 5B illustrate examples of simulations of the light extraction efficiency of light emitting display apparatuses according to a comparative example and an exemplary embodiment of the present disclosure. FIG. 5A illustrates a simulation of the light extraction efficiency of a light emitting display apparatus according to one comparative example using the Ray Optics Simulation program. FIG. 5B illustrates a simulation of the light extraction efficiency of a light emitting display apparatus according to an exemplary embodiment of the present disclosure using the Ray Optics Simulation program. In the simulations, the refractive indexes of bank layers 40 and 140 were set to 1.6 and emission layers 52 and 152, second electrodes 53 and 153 and first encapsulation layers 71 and 171 were set as single areas S, respectively. Also, the refractive indexes of the areas S were set to 1.8 and the refractive indexes of second encapsulation layers 72 and 172 were set to 1.5. Further, it was assumed that air is present above the second encapsulation layers 72 and 172 in FIG. 5A and FIG. 5B, respectively. Furthermore, the refractive index of the air was set to 1. Herein, the thicknesses of the bank layers 40 and 140 were set to 1 µm to assume that the bank layers 40 and 140 are formed of an organic material, and the bank layers and 140 were assumed as having even upper surfaces, respectively. The simulations as shown in FIG. 5A and FIG. 5B were about the light extraction occurring on the side portion and the upper portion of the protrusion portion 132. Therefore, an illustration of light emitted to a central region is omitted.

With reference to FIG. 5A, in a light emitting display apparatus 10 according to the comparative example, an uneven portion is not formed on a protrusion portion of an overcoating layer 30. Thus, the first electrode 51, the bank layer 40 and the area S have even upper surfaces on the protrusion portion. Therefore, a large number of lights are still confined or trapped in the area S. Further, some lights changed in traveling direction near a side portion of the protrusion portion at which a slope is changed can be emitted to the outside but emitted at a high angle. Therefore, since these lights have a high incident angle, they may not be emitted to the outside of the second encapsulation layer 72 and most of the lights are confined or trapped by total reflection at an interface between the second encapsulation layer 72 and air.

With reference to FIG. 5B, in the light emitting display apparatus 100 according to an exemplary embodiment of the present disclosure, the first electrode 151 is disposed along the shape of the uneven portion 132a disposed on the upper surface of the protrusion portion 132. Thus, it is possible to change a traveling direction of light confined or trapped in the light emitting display apparatus 100. Therefore, it is possible to increase the light extraction efficiency and front surface efficiency of the light emitting display apparatus 100. For example, some of lights emitted from the emission layer 152 can be reflected one or more times by the first electrode 151 having an uneven shape and changed in traveling direction so as to travel toward the front surface of the light emitting display apparatus 100. Therefore, in the light emitting display apparatus 100 according to an exemplary embodiment of the present disclosure, the first electrode 151 is disposed along the shape of the uneven portion 132a of the protrusion portion 132. Thus, it is possible to change a traveling direction of light that can be confined or trapped in the light emitting display apparatus 100 to the front direction of light emitting display apparatus 100. The light that has been changed in traveling direction can be extracted to the outside of the light emitting display apparatus 100. Accordingly, it is possible to increase the light extraction efficiency and front surface efficiency of the light emitting display apparatus 100.

The light extraction efficiency of the light emitting display apparatus 10 according to the comparative example illustrated in FIG. 5A is compared to that of the light emitting display apparatus 100 according to an exemplary embodiment of the present disclosure illustrated in FIG. 5B with reference to Table 1. It can be seen that the light emitting display apparatus 100 according to an exemplary embodiment of the present disclosure increases in the number of lights extracted to the outside by 13.3% compared to the light emitting display apparatus 10 according to the comparative example.

TABLE 1

|  | Light emitting display apparatus 10 | Light emitting display apparatus 100 |
|---|---|---|
| Number of lights | 30 | 34 |
| Rate of increase | — | 13.3% |

Figure 6A:
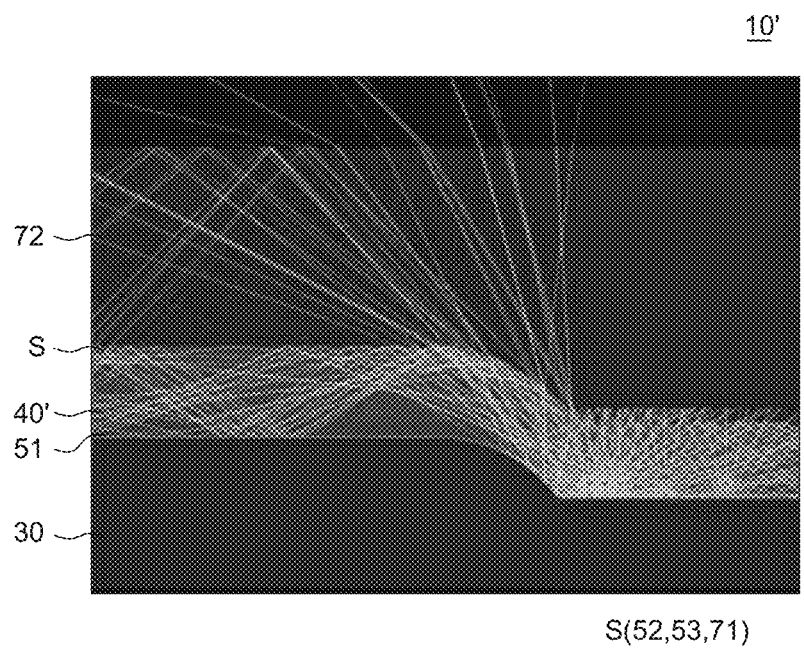
FIG. 6A and FIG. 6B illustrate examples of simulations of the light extraction efficiency of light emitting display apparatuses according to a comparative example and another exemplary embodiment of the present disclosure, respectively.
Figure 6B:
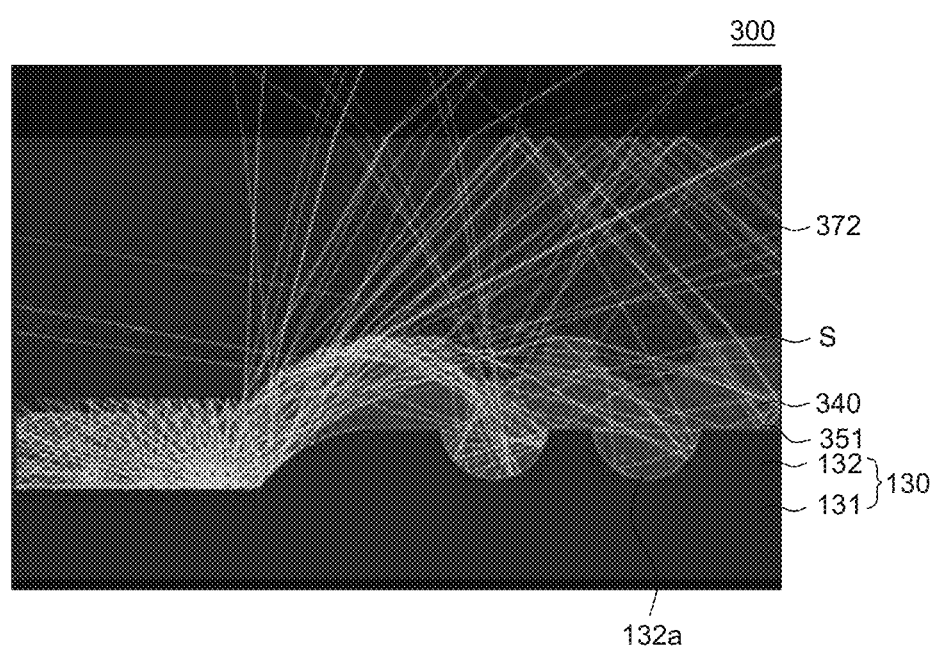

FIG. 6A and FIG. 6B illustrate examples of simulations of the light extraction efficiency of light emitting display apparatuses according to a comparative example and another exemplary embodiment of the present disclosure, respectively. FIG. 6A illustrates a simulation of the light extraction efficiency of a light emitting display apparatus according to one comparative example using the Ray Optics Simulation program. FIG. 6B illustrates a simulation of the light extraction efficiency of a light emitting display apparatus according to another exemplary embodiment of the present disclosure using the Ray Optics Simulation program. For the simulations, the refractive indexes of bank layers 40' and 340 were set to 1.8 and the emission layers 52 and 352, the second electrodes 53 and 353 and the first encapsulation layers 71 and 371 were set as single areas S, respectively. Also, the refractive indexes of the areas S were set to 1.9 and the refractive indexes of the second encapsulation layers 72 and 372 were set to 1.5. Further, it was assumed that air is present above the second encapsulation layers 72 and 372 in FIG. 6A and FIG. 6B, respectively. Furthermore, the refractive index of the air was set to 1. Herein, the thicknesses of the bank layers 40' and 340 were set to 0.2 μm to assume that the bank layers 40' and 340 are formed of an inorganic material. Further, the bank layer 40' illustrated in FIG. 6A was assumed as having an even upper surface and the bank layer 340 illustrated in FIG. 6B was assumed as having an uneven upper surface. The simulations as shown in FIG. 6A and FIG. 6B were about the light extraction occurring on the side portion and the upper portion of the protrusion portion 132. Therefore, an illustration of light emitted to a central region is omitted.

With reference to FIG. 6A, in a light emitting display apparatus 10' according to the comparative example, an uneven portion is not formed on a protrusion portion of the overcoating layer 30. Thus, the first electrode 51, the bank layer 40' and the area S have even upper surfaces on the protrusion portion. Therefore, a large number of lights are still confined or trapped in the area S. Further, some lights changed in traveling direction near a side portion of the protrusion portion at which a slope is changed can be emitted to the outside but emitted at a high angle. Therefore, since these lights have a high incident angle, they cannot be emitted to the outside of the second encapsulation layer 72 and most of the lights are confined or trapped by total reflection at an interface between the second encapsulation layer 72 and air.

With reference to FIG. 6B, in the light emitting display apparatus 300 according to another exemplary embodiment of the present disclosure, the first electrode 351 is disposed along the shape of the uneven portion 132a disposed on the upper surface of the protrusion portion 132. Thus, it is possible to change a traveling direction of light confined or trapped in the light emitting display apparatus 300. Therefore, it is possible to increase the light extraction efficiency and front surface efficiency of the light emitting display apparatus 300. For example, some of lights emitted from the emission layer 152 can be reflected one or more times by the first electrode 351 having an uneven shape and changed in traveling direction so as to travel toward the front surface of the light emitting display apparatus 300. Therefore, in the light emitting display apparatus 300 according to another exemplary embodiment of the present disclosure, the first electrode 351 is disposed along the shape of the uneven portion 132a of the protrusion portion 132. Thus, it is possible to change a traveling direction of light that can be confined or trapped in the light emitting display apparatus 300 to the direction toward the front surface. The light that has been changed in traveling direction can be extracted to the outside of the light emitting display apparatus 300. Accordingly, it is possible to increase the light extraction efficiency and front surface efficiency of the light emitting display apparatus 300.

The light extraction efficiency of the light emitting display apparatus 10' according to the comparative example illustrated in FIG. 6A is compared with that of the light emitting display apparatus 300 according to another exemplary embodiment of the present disclosure illustrated in FIG. 6B with reference to Table 2. It can be seen that the light emitting display apparatus 300 according to another exemplary embodiment of the present disclosure increases in the number of lights extracted to the outside by 30% compared to the light emitting display apparatus 10' according to the comparative example.

TABLE 2

|  | Light emitting display apparatus 10' | Light emitting display apparatus 300 |
| --- | --- | --- |
| Number of lights | 20 | 26 |
| Rate of increase | — | 30% |

Figure 7A:
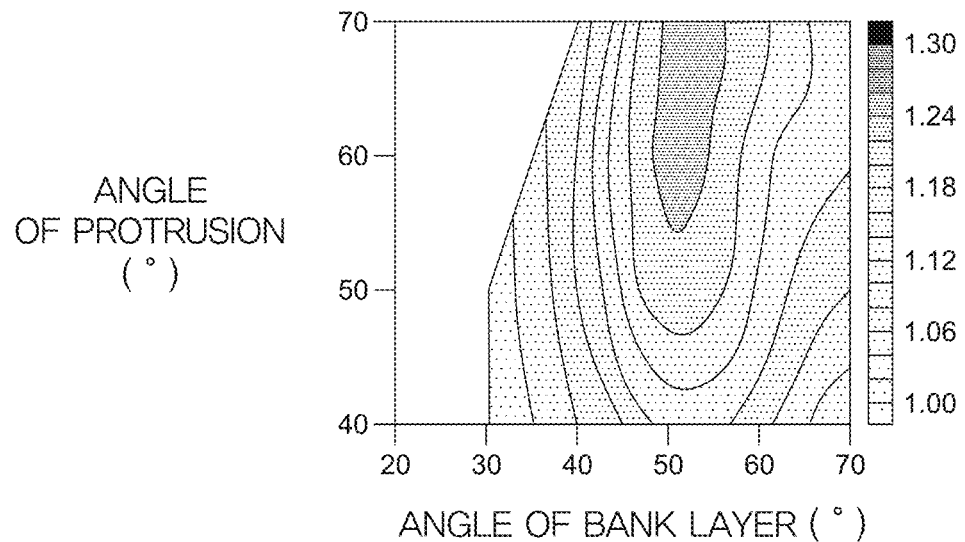
FIG. 7A to FIG. 7D illustrate examples of a light extraction efficiency based on the angles of side portions of a protrusion portion and a bank layer in light emitting display apparatuses according to an exemplary embodiment of the present disclosure and another exemplary embodiment of the present disclosure, respectively.
Figure 7B:
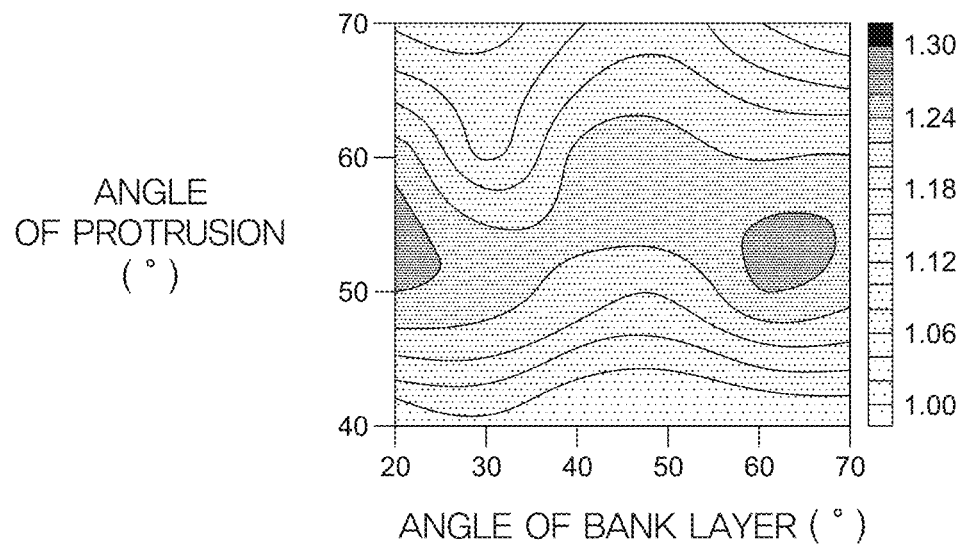
Figure 7C:
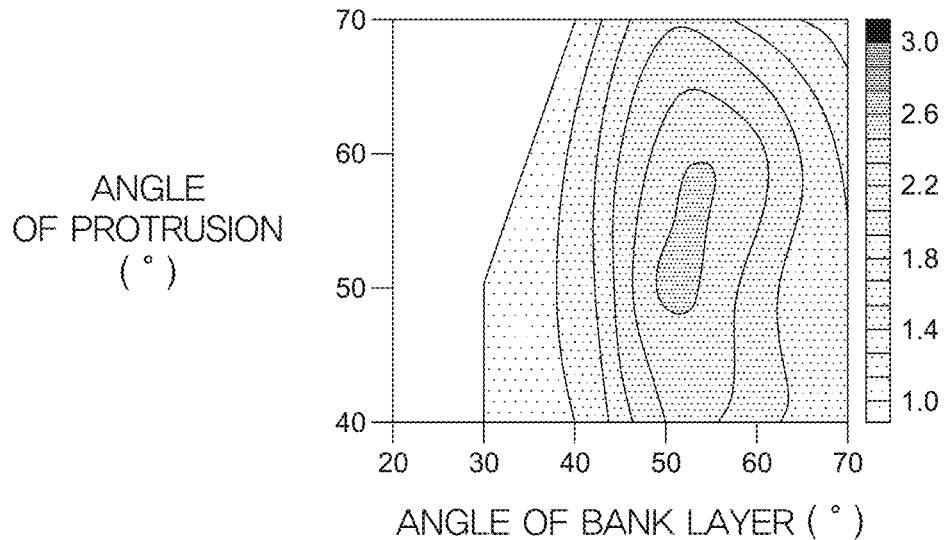
Figure 7D:
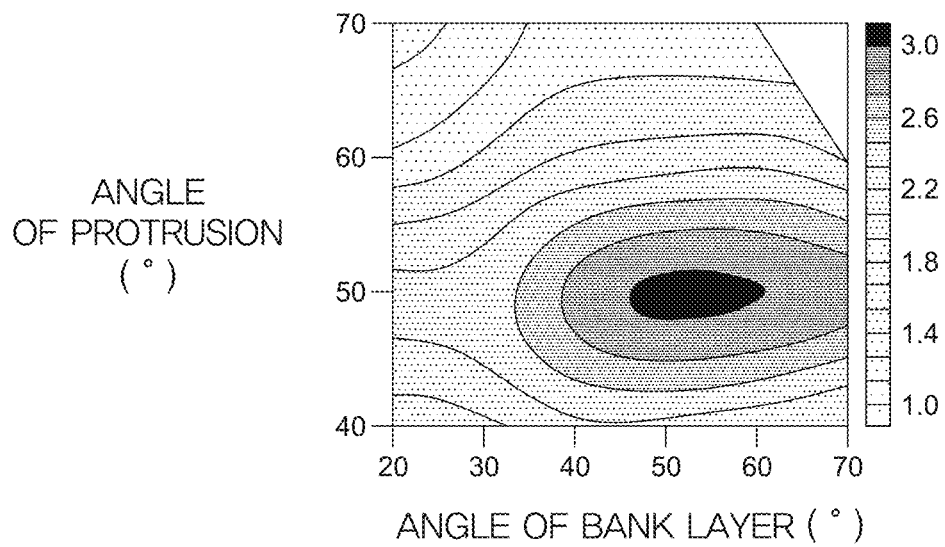

FIG. 7A to FIG. 7D illustrate examples of the light extraction efficiency based on the angles of side portions of a protrusion portion and a bank layer in light emitting display apparatuses according to an exemplary embodiment of the present disclosure and another exemplary embodiment of the present disclosure. FIG. 7A illustrates the light extraction efficiency based on the angles of a protrusion portion and a bank layer in a light emitting display apparatus according to an exemplary embodiment of the present disclosure in which light emitting dipoles within an emission layer are aligned horizontally. FIG. 7B illustrates the light extraction efficiency based on the angles of a protrusion portion and a bank layer in a light emitting display apparatus according to another exemplary embodiment of the present disclosure in which light emitting dipoles within an emission layer are aligned horizontally. FIG. 7C illustrates the light extraction efficiency based on the angles of a protrusion portion and a bank layer in a light emitting display apparatus according to an exemplary embodiment of the present disclosure in which light emitting dipoles within an emission layer are aligned vertically. FIG. 7D illustrates the light extraction efficiency based on the angles of a protrusion portion and a bank layer in a light emitting display apparatus according to another exemplary embodiment of the present disclosure in which light emitting dipoles within an emission layer are aligned vertically. In the light emitting display apparatuses 100 and 300 illustrated in FIG. 7A to FIG. 7D, a material of the protrusion portion 132 was set to poly aluminum chloride (PAC). Further, in the light emitting display apparatus 100 according to an exemplary embodiment of the present disclosure illustrated in FIG. 7A and FIG. 7C, the bank layer 140 was set to polyimide (PI) that is an organic material. In the light emitting display apparatus 300 according to another exemplary embodiment of the present disclosure illustrated in FIG. 7B and FIG. 7D, the bank layer 340 was set to silicon nitride (SiNx) that is an inorganic material. In FIG. 7A to FIG. 7D, the X-axis represents the angle of a side portion of the bank layer 140 or 340 and the Y-axis represents the angle of a side portion of the protrusion portion 132. In FIG. 7A to FIG. 7D, the density of dots represents the light extraction efficiency. For example, the light extraction efficiency is shown as a multiple with respect to the light extraction efficiency of 1 in a sparsest region. For example, in FIG. 7A to FIG. 7D, the denser the dots, the higher the light extraction efficiency. In a section where the side portion of the protrusion portion 132 has an angle of from about 40° to about 70° and the side portion of the bank layer 140 has an angle of from about 20° to about 30° in FIG. 7A and FIG. 7C and a section where the side portion of the protrusion portion 132 has an angle of from about 60° to about 70° and the side portion of the bank layer 340 has an angle of from about 60° to about 70° in FIG. 7D, the light extraction efficiency may not be measured due to a structure reversed by the angles of the side portions of the protrusion portion 132 and the bank layers 140 and 340.

With reference to FIG. 7A, in the light emitting display apparatus 100 according to an exemplary embodiment of the present disclosure, as the angles of the side portions of the bank layer 140 and the protrusion portion 132 increase gradually, the light extraction efficiency increases gradually. For example, the light extraction efficiency can be the highest in a section where the side portion of the bank layer 140 has an angle of from about 45° to about 55° and the side portion of the protrusion portion 132 has an angle of from about 55° to about 70°. However, the light extraction efficiency decreases as the angle of the side portion of the bank layer 140 further increases from about 55° to about 70°, compared to the section where the side portion of the bank layer 140 has an angle of from about 45° to about 55°.

With reference to FIG. 7B, the light emitting display apparatus 300 according to another exemplary embodiment of the present disclosure shows the light extraction efficiency overall even if the side portions of the bank layer 340 and the protrusion portion 132 are formed at any angle. Particularly, the light extraction efficiency can be the highest in a section where the side portion of the bank layer 340 has an angle of from about 20° to about 25° and the side portion of the protrusion portion 132 has an angle of from about 50° to about 60° and a section where the side portion of the bank layer 340 has an angle of from about 60° to about 70° and the side portion of the protrusion portion 132 has an angle of from about 50° to about 55°.

With reference to FIG. 7C, as the angles of the side portions of the bank layer 140 and the protrusion portion 132 increase gradually, the light extraction efficiency increases gradually. For example, the light extraction efficiency can be the highest in a section where the side portion of the bank layer 140 has an angle of from about 50° to about 55° and the side portion of the protrusion portion 132 has an angle of from about 48° to about 68°. However, the light extraction efficiency decreases as the angle of the side portion of the bank layer 140 further increases from about 55° to about 70°, compared to the section where the side portion of the bank layer 140 has an angle of from about 45° to about 55°.

With reference to FIG. 7D, the light emitting display apparatus 300 according to another exemplary embodiment of the present disclosure shows the light extraction efficiency overall even if the side portions of the bank layer 340 and the protrusion portion 132 are formed at any angle. Particularly, the light extraction efficiency can be the highest in a section where the side portion of the bank layer 340 has an angle of from about 48° to about 60° and the side portion of the protrusion portion 132 has an angle of from about 48° to about 53°.

Figure 8A:
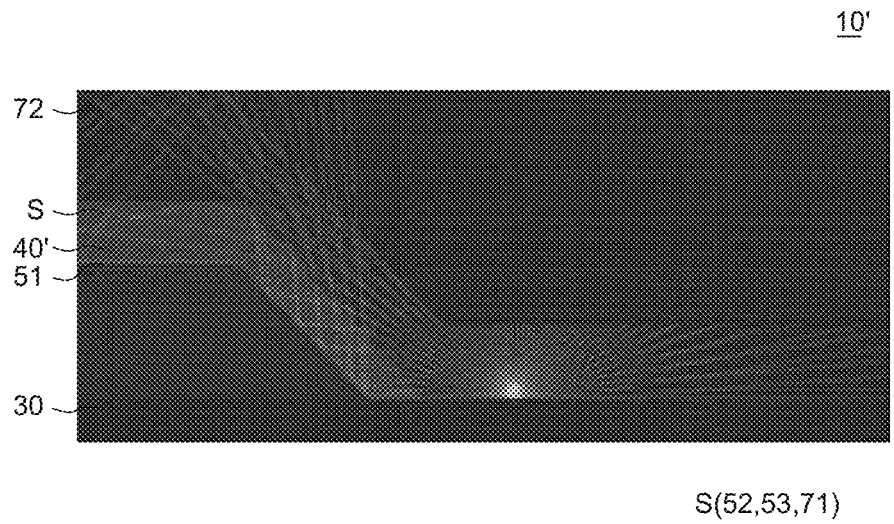
FIG. 8A and FIG. 8B illustrate examples of simulations of the light extraction efficiency of light emitting display apparatuses according to a comparative example and yet another exemplary embodiment of the present disclosure, respectively.
Figure 8B:
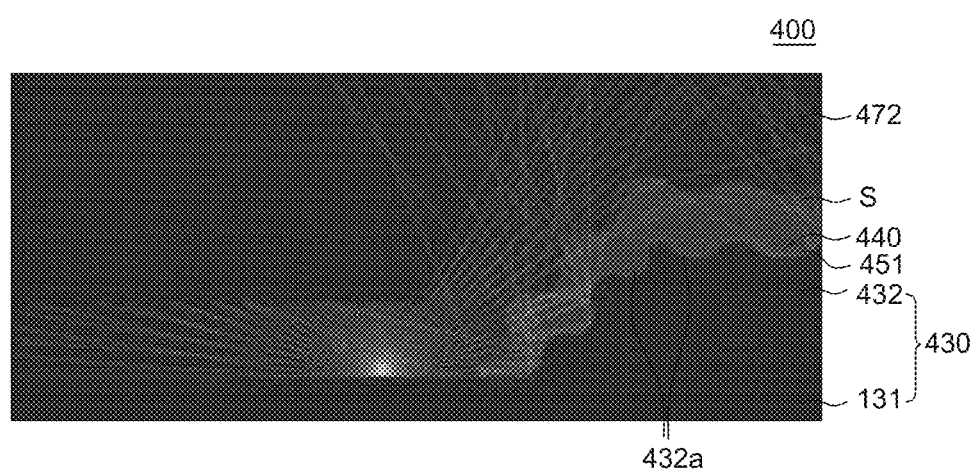

FIG. 8A and FIG. 8B illustrate examples of simulations of the light extraction efficiency of light emitting display apparatuses according to a comparative example and yet another exemplary embodiment of the present disclosure. FIG. 8A illustrates a simulation of the light extraction efficiency of a light emitting display apparatus according to one comparative example using the Ray Optics Simulation program. FIG. 8B illustrates a simulation of the light extraction efficiency of a light emitting display apparatus according to another exemplary embodiment of the present disclosure using the Ray Optics Simulation program. For the simulations, the refractive indexes of the bank layers 40' and 440 were set to 1.8 and the emission layers 52 and 452, the second electrodes 53 and 453 and the first encapsulation layers 71 and 471 were set as single areas S. Also, the refractive indexes of the areas S were set to 1.8 and the refractive indexes of the second encapsulation layers 72 and 472 were set to 1.5. Further, it was assumed that air is present above the second encapsulation layers 72 and 472 in FIG. 8A and FIG. 8B, respectively. Furthermore, the refractive index of the air was set to 1. Herein, the thicknesses of the bank layers 40' and 440 were set to 0.2 µm to assume that the bank layers 40' and 440 are formed of an inorganic material. Further, the bank layer 40' illustrated in FIG. 8A was assumed as having an even upper surface and the bank layer 440 illustrated in FIG. 8B was assumed as having an uneven surface and an uneven side portion. The simulations as shown in FIG. 8A and FIG. 8B were about the light extraction occurring on the side portion and the upper portion of the protrusion portion 432. Therefore, an illustration of light emitted to a central region is omitted.

With reference to FIG. 8A, in the light emitting display apparatus 10' according to the comparative example, an uneven portion is not formed on a protrusion portion of the overcoating layer 30. Thus, the first electrode 51, the bank layer 40' and the area S have even upper surfaces on the protrusion portion. Therefore, a large number of lights are still confined or trapped in the area S. Further, some lights changed in traveling direction near a side portion of the protrusion portion at which a slope is changed can be emitted to the outside but emitted at a high angle. Therefore, since these lights have a high incident angle, they may not be emitted to the outside of the second encapsulation layer 72 and most of the lights are confined or trapped by total reflection at an interface between the second encapsulation layer 72 and air.

With reference to FIG. 8B, in the light emitting display apparatus 400 according to another exemplary embodiment of the present disclosure, the first electrode 451 and the bank layer 440 are disposed along the shape of the uneven portion 432a disposed on the upper surface of the protrusion portion 432. Thus, it is possible to change a traveling direction of light confined or trapped in the light emitting display apparatus 400. Therefore, it is possible to increase the light extraction efficiency and front surface efficiency of the light emitting display apparatus 400. For example, some of lights emitted from the emission layer 452 can be scattered by the first electrode 451 and the bank layer 440 having an uneven shape and changed in traveling direction so as to travel toward the front surface of the light emitting display apparatus 400. Therefore, in the light emitting display apparatus 400 according to another exemplary embodiment of the present disclosure, the first electrode 451 and the bank layer 440 are disposed along the shape of the uneven portion 432a of the protrusion portion 432. Thus, it is possible to change a traveling direction of light that can be confined in the light emitting display apparatus 400 to the direction toward the front surface. The light that has been changed in traveling direction can be extracted to the outside of the light emitting display apparatus 400.

Accordingly, it is possible to increase the light extraction efficiency and front surface efficiency of the light emitting display apparatus 400.

The light extraction efficiency of the light emitting display apparatus 10' according to the comparative example illustrated in FIG. 8A is compared with that of the light emitting display apparatus 400 according to another exemplary embodiment of the present disclosure illustrated in FIG. 8B with reference to Table 3. It can be seen that the light emitting display apparatus 400 according to another exemplary embodiment of the present disclosure increases in the number of lights extracted to the outside by 54% compared to the light emitting display apparatus 10' according to the comparative example.

TABLE 3

| | Light emitting display apparatus 10' | Light emitting display apparatus 400 |
|---|---|---|
| Number of lights | 13 | 20 |
| Rate of increase | — | 54% |

Figure 9:
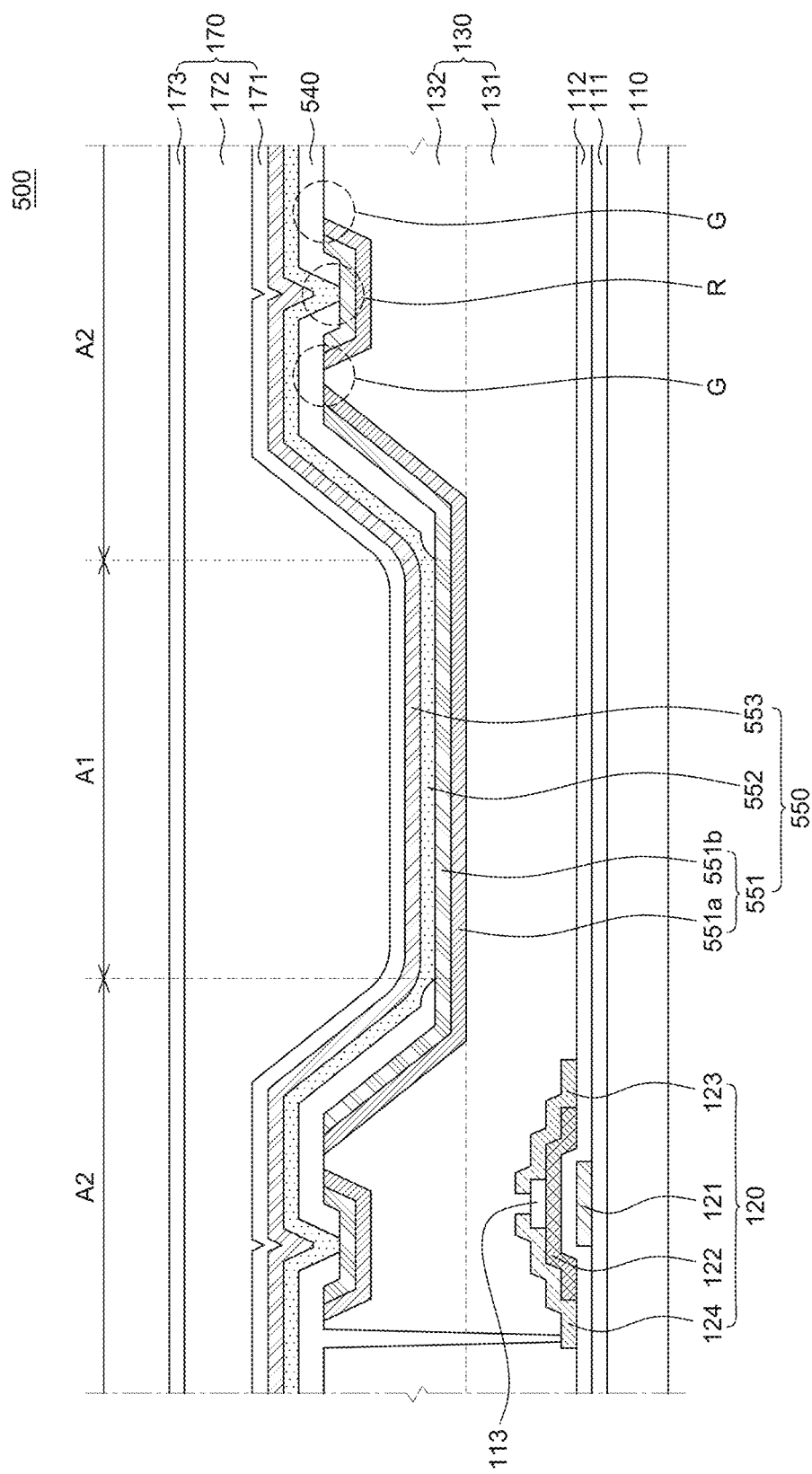
FIG. 9 is a cross-sectional view of a light emitting display apparatus according to another exemplary embodiment of the present disclosure.

FIG. 9 is a cross-sectional view of a light emitting display apparatus 500 according to another exemplary embodiment of the present disclosure, where the cross-section is taken in a similar manner as the cross-section taken for FIG. 2. A light emitting display apparatus 500 illustrated in FIG. 9 is substantially the same as the light emitting display apparatus 100 illustrated in FIG. 1 and FIG. 2 except a first electrode 551, a bank layer 540 and a light emitting element 550. Therefore, its redundant description will be omitted or will be brief.

If the bank layer 540 is formed of an organic material, light is confined or trapped in the light emitting display apparatus 500, e.g., in an emission layer 552, due to a difference in refractive indexes between the bank layer 540 and the emission layer 552. Thus, the light cannot be output in a direction toward a front surface of the light emitting display apparatus 500. For example, a material of the bank layer 540 has a refractive index of about 1.6 and an organic material of the emission layer 552 has a refractive index of from about 1.8 to about 1.9. Due to a difference in refractive indexes between the emission layer 552 and the bank layer 540, light from the emission layer 552 may not be extracted to the front surface of the light emitting display apparatus 500 and can be lost to a side surface or a side portion of the light emitting display apparatus 500. The light emitted to the side surface or the side portion travels toward the inside of the light emitting display apparatus 500 and can be confined or trapped in the light emitting display apparatus 500 by total reflection. Otherwise, the light can travel into the light emitting display apparatus 500 and become extinct.

Accordingly, in the light emitting display apparatus 500 according to another exemplary embodiment of the present disclosure, the first electrode 551 is disposed on the overcoating layer 130 and can be divided into at least two areas. The at least two areas are disposed on the protrusion portion 132 of the overcoating layer 130 and can include a first area G and a second area R. The first area G can refer to an area where light from the emission layer 552 is confined or trapped by a slanted surface of the protrusion portion 132 of the overcoating layer 130 and may not be output in the direction toward the front surface of the light emitting display apparatus 500. Therefore, a partial region of the first electrode 551 can be disposed in a short or floating state to guide light from the emission layer 552. For example, the first electrode 551 can be in a floating state in the first area G. The partial region of the first electrode 551 can be the first area G and can be a light guide area. The first area G can guide light from the emission layer 552 to be output toward the front surface of the light emitting display apparatus 500. For example, the first electrode 551 except the first area G can be disposed in the second area R. Thus, light from the emission layer 552 is not confined or trapped by the protrusion portion 132 of the overcoating layer 130 and can be guided to an interface of the first electrode 551 disposed in the area other than the first area G. For example, the first electrode 551 can guide light emitted from the emission layer 552 to the first area G and the light guided to the first area G can be extracted to an interface between the first electrode 551 and the emission layer 552.

In the second area A2 that is a non-emission area, the bank layer 540 can be disposed on the first electrode 551. For example, the bank layer 540 can be divided into at least two areas so that light from the emission layer 552 can be guided to the interface of the first electrode 551 through the first area G. For example, if the bank layer 540 is not divided into at least two areas, light guided to the first electrode 551 may not be extracted to the front surface and can be confined or trapped in the light emitting display apparatus 500. The at least two areas can be divided in an area where the first electrode 551 is formed. For example, the bank layer 540 can be divided into at least two areas so that light from the emission layer 552 can be guided to the interface of the first electrode 551 and output toward the front surface of the light emitting display apparatus 500. For example, the at least two areas can be separated between the first electrode 551 and the emission layer 552 so that an interface between the first electrode 551 and the emission layer 552 can be formed in the area where the first electrode 551 is present. For example, the bank layer 540 can be disposed on the second area R. The bank layer 540 can be disposed in the second area R except an interface between the first electrode 551 and the emission layer 552. For example, the bank layer 540 can be divided into two bank layers so that the second area R can be opened at the interface between the first electrode 551 and the emission layer 552. The second area R can be a reflective area where light from the emission layer 552 is reflected and output toward the front surface of the light emitting display apparatus 500. For example, the second area R can be a reflective interface between the first electrode 551 and the emission layer 552. Also, the bank layer 540 disposed on the first electrode 551 is formed except on the reflective interface between the first electrode 551 and the emission layer 552. Therefore, light guided from the light emitting element 550 can be guided to the first electrode 551. Thus, the light guided along the emission layer 552 can be guided to the reflective interface between the first electrode 551 and the emission layer 552. Therefore, it is possible to increase the amount of light to be extracted to the front surface of the light emitting display apparatus 500. That is, the bank layer 540 is disposed so that the interface between the first electrode 551 and the emission layer 552 can be opened or floated.

Accordingly, light to be lost from the emission layer 552 to the side surface can be guided to the interface of the first electrode 551. Thus, it is possible to extract the light from the interface to the front surface of the light emitting display apparatus 500. For example, the bank layer 540 can be floated so that the first electrode 551 and the emission layer 552 can be in contact with each other in a part of the second area R. Therefore, the emission layer 552 can be brought into direct contact with the first electrode 551 by the divided bank layers 540. Also, light to be lost to the side surface of the light emitting display apparatus 500 can be extracted to the front surface. Accordingly, it is possible to enhance the light extraction efficiency.

The first electrode 551 can include a reflective layer 551a and a transparent conductive layer 551b disposed on the reflective layer 551a. The reflective layer 551a of the first electrode 551 can be disposed on the overcoating layer 130. The light emitting display apparatus 500 according to another exemplary embodiment of the present disclosure is a top emission type light emitting display apparatus. Thus, the reflective layer 551a can reflect light emitted from the light emitting element 550 upwards.

The emission layer 552 can be disposed on the first electrode 551 and the bank layer 540. The emission layer 552 can be disposed along an upper surface of the bank layer 540. For example, the emission layer 552 can be disposed on a part including the interface between the first electrode 551 and the emission layer 552 in the second area R. Thus, the emission layer 552 can be in direct contact with an upper surface of the first electrode 551. Therefore, light from the light emitting element 550 can be guided to the interface of the first electrode 551 and light to be lost to the side surface can be extracted to the front surface of the light emitting display apparatus 500. Accordingly, it is possible to increase the light extraction efficiency.

A second electrode 553 can be disposed on the emission layer 552. The second electrode 553 can be disposed along an upper surface of the emission layer 552. The encapsulation part 170 can be disposed on the light emitting element 550. The encapsulation part 170 can be disposed to cover the second electrode 553. The first encapsulation layer 171 can be disposed on the second electrode 553. The second encapsulation layer 172 can be disposed on the first encapsulation layer 171. The second encapsulation layer 172 can be disposed on the first encapsulation layer 171 to flatten the surface of the first encapsulation layer 171. The third encapsulation layer 173 can be disposed on the second encapsulation layer 172.

In the light emitting display apparatus 500 according to another exemplary embodiment of the present disclosure, the first electrode 551 is divided, and the bank layer 540 is divided at the interface between the first electrode 551 and the emission layer 552. Thus, it is possible to increase the light extraction efficiency of the light emitting display apparatus 500. For example, some of light emitted from the emission layer 552 can be reflected by the first electrode 551 having a side mirror structure and extracted to the outside of the light emitting display apparatus 500. However, the rest of the light emitted from the emission layer 552 can be confined or trapped in the light emitting display apparatus 500. The bank layer 540 that guides light guided by the divided first electrode 551 to the interface between first electrode 551 and the emission layer 552 can change a traveling direction of light. For example, light output from the emission layer 552 can be changed in traveling direction. Thus, the light can be guided to the surface of the first electrode 551 and extracted to the outside of the light emitting display apparatus 500. Therefore, light confined or trapped in the light emitting display apparatus 500 can be scattered by the divided first electrode 551 and the divided bank layer 540. Accordingly, it is possible to increase the light extraction efficiency of the light emitting display apparatus 500.

Figure 10A:
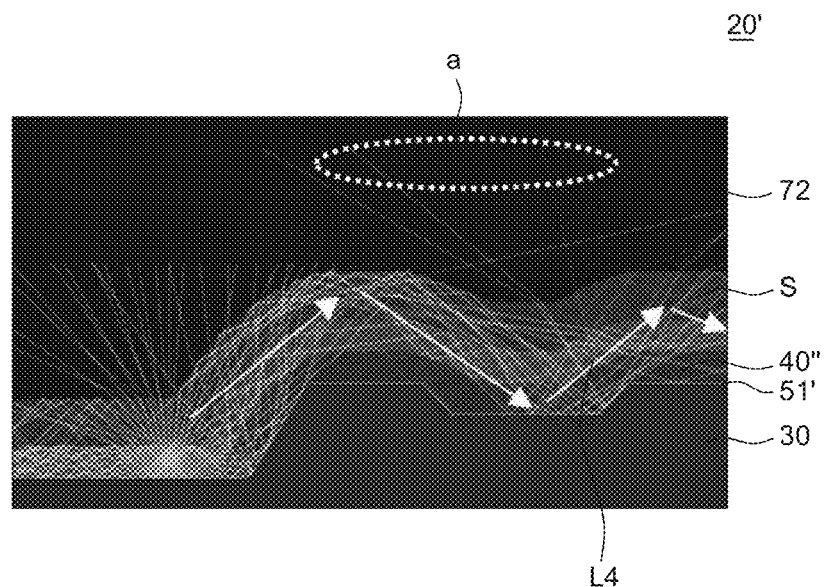
FIG. 10A and FIG. 10B illustrate examples of simulations of the light extraction efficiency of light emitting display apparatuses according to a comparative example and another exemplary embodiment of the present disclosure, respectively.
Figure 10B:
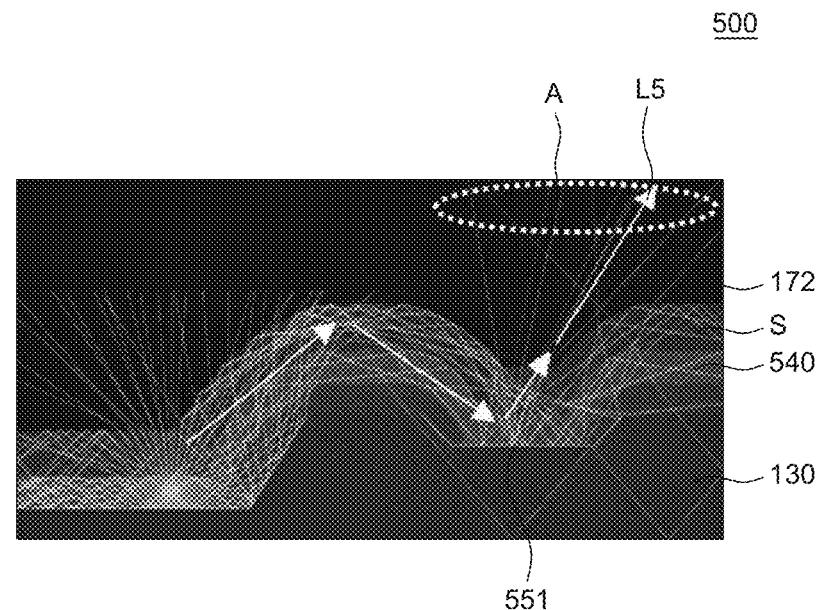

FIG. 10A and FIG. 10B illustrate examples of simulations of the light extraction efficiency of light emitting display apparatuses according to a comparative example and another exemplary embodiment of the present disclosure. FIG. 10A illustrates a simulation of the light extraction efficiency of a light emitting display apparatus according to one comparative example using the Ray Optics Simulation program. FIG. 10B illustrates a simulation of the light extraction efficiency of a light emitting display apparatus according to another exemplary embodiment of the present disclosure using the Ray Optics Simulation program. For the simulations, the refractive indexes of bank layers 40" and 540 were set to 1.6 and the emission layers 52 and 552, the second electrodes 53 and 553 and the first encapsulation layers 71 and 171 were set as single areas S, respectively. Also, the refractive indexes of the areas S were set to 1.8 and the refractive indexes of the second encapsulation layers 72 and 172 were set to 1.5. Further, it was assumed that the second encapsulation layer 172 is even. However, the second encapsulation layer 172 can be formed along the shape of the emission layer 552, the second electrode 553, and the first encapsulation layer 171 as shown in FIG. 9. Even in this case, it is possible to achieve the same or similar effect as illustrated in FIG. 10B. Further, it was assumed that air is present above the second encapsulation layers 72 and 172 in FIG. 10A and FIG. 10B. Furthermore, the refractive index of the air was set to 1. Herein, the thicknesses of the bank layers 40" and 540 were set to 1 μm to assume that the bank layers 40" and 540 are formed of an organic material, and the bank layers 40" and 540 were assumed as having even upper surfaces.

With reference to FIG. 10A, in a light emitting display apparatus 20' according to the comparative example, a first electrode 51' and the bank layer 40" is not divided. Thus, light in the area S may not be extracted from an interface of the first electrode 51' to the outside of the light emitting display apparatus 20'. Therefore, a large number of lights are still confined or trapped in the area S. Further, some lights changed in traveling direction near a side portion of the protrusion portion of the overcoating layer 30 at which a slope is changed are reflected by the first electrode 51' and emitted to a side surface. For example, a fourth light L4 is reflected near the side portion of the protrusion portion of the overcoating layer 30 to the first electrode 51' and emitted to the side surface. For example, lights in the area S may not be emitted to the outside of the encapsulation layer 72 and most of the lights are confined or trapped by total reflection at an interface between the second encapsulation layer 72 and air. Therefore, lights emitted to the side surface may not be emitted to the front surface of the light emitting display apparatus 20', and, thus, the number of lights extracted to the front surface (illustrated by "a") decreases.

With reference to FIG. 10B, in the light emitting display apparatus 500 according to another exemplary embodiment of the present disclosure, the first electrode 551 and the bank layer 540 is divided. Thus, it is possible to change a traveling direction of light confined in the light emitting display apparatus 500. Therefore, it is possible to increase the light extraction efficiency and front surface efficiency of the light emitting display apparatus 500. For example, light emitted from the emission layer 552 is guided to the divided first electrode 551 and the light guided to the first electrode 551 is extracted to the interface between the first electrode 551 and the emission layer 552 by the bank layer 540. Therefore, it is possible to change a traveling direction of the light to the direction toward the front surface of the light emitting display apparatus 500. For example, a fifth light L5 is guided to the divided first electrode 551 and the light guided to the first electrode 551 is extracted from the interface between the first electrode 551 and the emission layer 552 toward the front surface of the light emitting display apparatus 500 by the divided bank layer 540. Thus, the number of lights extracted to the front surface (illustrated by "A") increases. Therefore, in the light emitting display apparatus 500 according to another exemplary embodiment of the present disclosure, the first electrode 551 and the bank layer 540 is divided. Thus, it is possible to change a traveling direction of light to be confined in the area S, e.g., light that can be confined or trapped in the light emitting display apparatus 500, to the direction toward the front surface. The light that has been changed in traveling direction can be extracted to the outside of the light emitting display apparatus 500. Accordingly, it is possible to increase the light extraction efficiency and front surface efficiency of the light emitting display apparatus 500.

The light extraction efficiency of the light emitting display apparatus 20' according to the comparative example illustrated in FIG. 10A is compared with that of the light emitting display apparatus 500 according to another exemplary embodiment of the present disclosure illustrated in FIG. 10B with reference to Table 4. It can be seen that the light emitting display apparatus 500 according to another exemplary embodiment of the present disclosure increases in the number of lights extracted to the outside by about 12.1% compared to the light emitting display apparatus 20' according to the comparative example.

TABLE 4

|  | Light emitting display apparatus 20' | Light emitting display apparatus 500 |
| --- | --- | --- |
| Number of lights | 33 | 37 |
| Rate of increase | — | 12.1% |

A light emitting display apparatus according to one or more embodiments of the present disclosure will be described below.

According to an embodiment of the present disclosure, a light emitting display apparatus includes a substrate, an insulating layer on the substrate and including a base portion and a protrusion portion, the protrusion portion having an uneven portion in a part of the base portion, a first electrode configured to cover a upper portion of the base portion and a side portion and an upper portion of the protrusion portion and disposed along a shape of the uneven portion of the insulating layer, a bank layer configured to cover a part of the insulating layer and a part of the first electrode, an emission layer on the first electrode and the bank layer, and a second electrode on the emission layer.

According to some embodiments of the present disclosure, the uneven portion of the insulating layer can be disposed on an upper surface of the protrusion portion, the bank layer can include an organic material, and an upper surface of the bank layer can be evener than the upper surface of the protrusion portion.

According to some embodiments of the present disclosure, the uneven portion of the insulating layer can have at least one of a concave semicircular shape, a triangular shape, an oval shape, and a trapezoidal shape.

According to some embodiments of the present disclosure, the uneven portion of the insulating layer can have a depth in a range of approximately 1.5 μm to approximately 2 μm.

According to some embodiments of the present disclosure, the uneven portion of the insulating layer can be disposed on an upper surface of the protrusion portion, the bank layer can include an inorganic material, and the bank layer can be disposed along a shape of the first electrode.

According to some embodiments of the present disclosure, the uneven portion of the insulating layer can have at least one of a concave semicircular shape, a triangular shape, an oval shape, and a trapezoidal shape.

According to some embodiments of the present disclosure, the uneven portion of the insulating layer can have a depth in a range of approximately 1.5 μm to approximately 2 μm.

According to some embodiments of the present disclosure, the uneven portion of the insulating layer can be disposed on the side portion and an upper surface of the protrusion portion, the bank layer can be made of an inorganic material, and the bank layer can be disposed along the shape of the uneven portion.

According to some embodiments of the present disclosure, the uneven portion of the insulating layer can have a wrinkle shape.

According to some embodiments of the present disclosure, the light emitting display apparatus can further comprise a first encapsulation layer on the second electrode along a shape of the second electrode, and a second encapsulation layer on the first encapsulation layer, a refractive index of the second encapsulation layer can be lower than a refractive index of the first encapsulation layer.

According to some embodiments of the present disclosure, a refractive index of the bank layer can be equal to or lower than a refractive index of the emission layer.

According to some embodiments of the present disclosure, the first electrode can include a reflective layer and a transparent conductive layer on the reflective layer.

According to another embodiment of the present disclosure, a light emitting display apparatus includes a substrate, an overcoating layer on the substrate and including a base portion and a protrusion portion, a light emitting element on the overcoating layer and including a first electrode, an emission layer, and a second electrode, a bank layer between the first electrode and the emission layer and configured to define an emission area, an encapsulation part on the light emitting element, and a light extraction pattern on a surface of the protrusion portion of the overcoating layer and configured to change a traveling direction of light emitted from the emission layer and improve a light extraction efficiency and a front surface efficiency.

According to some embodiments of the present disclosure, the light extraction pattern can include a concave line pattern or a dot pattern on an upper surface of the protrusion portion of the overcoating layer.

According to some embodiments of the present disclosure, the light extraction pattern can be disposed to surround the emission area.

According to some embodiments of the present disclosure, the light extraction pattern can be disposed to have a wrinkle structure on a side surface and an upper surface of the protrusion portion of the overcoating layer.

According to some embodiments of the present disclosure, the wrinkle structure of the light extraction pattern can have an irregular wrinkle shape.

According to some embodiments of the present disclosure, the encapsulation part can include a first encapsulation layer, an organic encapsulation layer, and a second encapsulation layer, the first encapsulation layer can be disposed on the second electrode along the shape of the second electrode, the organic encapsulation layer can be on the first encapsulation layer, a refractive index of the organic encapsulation layer can be lower than a refractive index of the first encapsulation layer, and a refractive index of the bank layer can be equal to or lower than a refractive index of the emission layer.

According to another embodiment of the present disclosure, a light emitting display apparatus includes a substrate, an insulating layer on the substrate and including a base portion and a protrusion portion in a part of the base portion, and an upper surface of the protrusion portion including a first area and a second area between the first areas, a first electrode in the first area and the second area, a bank layer in a part of the second area other than an interface between the first electrode and an emission layer, the emission layer being on the first electrode and the bank layer, and a second electrode on the emission layer.

According to some embodiments of the present disclosure, the first electrode can be disposed in a floating state in the first area.

According to some embodiments of the present disclosure, the bank layer can be floated so that the first electrode and the emission layer are in contact with each other at the interface of the second area.

According to some embodiments of the present disclosure, the first electrode can be configured to guide light emitted from the emission layer to the first area and the light guided to the first area can be extracted to an interface between the first electrode and the emission layer.

According to some embodiments of the present disclosure, the bank layer can include an organic material.

According to another aspect of the present disclosure, a light emitting display apparatus includes an overcoating layer on a substrate and including a base portion and a protrusion portion. The protrusion portion includes an uneven portion at a part of the base portion. The light emitting display apparatus further includes a first electrode including a reflective layer on the overcoating layer and a transparent conductive layer on the reflective layer. The light emitting display apparatus includes a bank layer configured to cover a part of the overcoating layer and a part of the first electrode. The light emitting display apparatus includes an emission layer on the first electrode and the bank layer and a second electrode on the emission layer. A distance between the reflective layer of the first electrode and the second electrode is configured to adjust to implement a constructive interference for light emitted from the emission layer.

According to some embodiments of the present disclosure, the uneven portion of the overcoating layer may be disposed on an upper surface of the protrusion portion.

According to some embodiments of the present disclosure, the uneven portion of the overcoating layer may have at least one of a concave semicircular shape, a triangular shape, an oval shape, and a trapezoidal shape.

According to some embodiments of the present disclosure, the uneven portion of the overcoating layer may have a depth in a range of approximately 1.5 μm to approximately 2 μm.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. A light emitting display apparatus, comprising:
   an insulating layer on a substrate and including a base portion and a protrusion portion disposed on the base portion, the protrusion portion exposing a part of the base portion;
   an uneven portion disposed on an upper surface of the protrusion portion;
   a first electrode configured to cover an upper portion of the base portion which is exposed by the protrusion portion, and a side portion and an upper portion of the protrusion portion, and disposed along a shape of the uneven portion of the insulating layer;
   a bank layer configured to cover a part of the insulating layer and a part of the first electrode, and overlap with the uneven portion;
   an emission layer on the first electrode and the bank layer; and
   a second electrode on the emission layer,
   wherein the uneven portion disposed on the upper surface of the protrusion portion is parallel with the base portion or the substrate.

2. The light emitting display apparatus of claim 1, wherein:
   the bank layer includes an organic material; and
   an upper surface of the bank layer is evener than the upper surface of the protrusion portion.

3. The light emitting display apparatus of claim 1, wherein the uneven portion of the insulating layer has at least one of a concave semicircular shape, a triangular shape, an oval shape, and a trapezoidal shape.

4. The light emitting display apparatus of claim 1, wherein the uneven portion of the insulating layer has a depth in a range of approximately 1.5 μm to approximately 2 μm.

5. The light emitting display apparatus of claim 1, wherein:
   the bank layer includes an inorganic material; and
   the bank layer is disposed along a shape of the first electrode.

6. The light emitting display apparatus of claim 5, wherein the uneven portion has at least one of a concave semicircular shape, a triangular shape, an oval shape, and a trapezoidal shape.

7. The light emitting display apparatus of claim 5, wherein the uneven portion has a depth in a range of approximately 1.5 μm to approximately 2 μm.

8. The light emitting display apparatus of claim 1, wherein:
   the uneven portion is disposed on the side portion and the upper surface of the protrusion portion;
   the bank layer includes an inorganic material; and
   the bank layer is disposed along the shape of the uneven portion.

9. The light emitting display apparatus of claim 8, wherein the uneven portion has a wrinkle shape.

10. The light emitting display apparatus of claim 1, further comprising:
    a first encapsulation layer on the second electrode along a shape of the second electrode; and
    a second encapsulation layer on the first encapsulation layer,
    wherein a refractive index of the second encapsulation layer is lower than a refractive index of the first encapsulation layer.

11. The light emitting display apparatus of claim 10, wherein a refractive index of the bank layer is equal to or lower than a refractive index of the emission layer.

12. The light emitting display apparatus of claim 1, wherein the first electrode includes a reflective layer and a transparent conductive layer on the reflective layer.

13. A light emitting display apparatus, comprising:
    an overcoating layer on a substrate and including a base portion and a protrusion portion disposed on the base portion, the protrusion portion exposing a part of the base portion;
    a light emitting element on the overcoating layer and including a first electrode, an emission layer, and a second electrode;

a bank layer between the first electrode and the emission layer, and configured to define an emission area;

an encapsulation part on the light emitting element; and a light extraction pattern on an upper surface of the protrusion portion of the overcoating layer, and overlapping with the bank layer, and configured to change a traveling direction of light emitted from the emission layer and improve a light extraction efficiency and a front surface efficiency, wherein the light extraction pattern disposed on the upper surface of the protrusion portion is parallel with the base portion or the substrate.

14. The light emitting display apparatus of claim 13, wherein the light extraction pattern includes a concave line pattern or a dot pattern on the upper surface of the protrusion portion of the overcoating layer.

15. The light emitting display apparatus of claim 14, wherein the light extraction pattern is disposed to surround the emission area.

16. The light emitting display apparatus of claim 13, wherein the light extraction pattern is disposed to have a wrinkle structure on a side surface and the upper surface of the protrusion portion of the overcoating layer.

17. The light emitting display apparatus of claim 16, wherein the wrinkle structure of the light extraction pattern has an irregular wrinkle shape.

18. The light emitting display apparatus of claim 13, wherein:

the encapsulation part includes a first encapsulation layer, an organic encapsulation layer, and a second encapsulation layer;

the first encapsulation layer is on the second electrode along a shape of the second electrode;

the organic encapsulation layer is on the first encapsulation layer;

a refractive index of the organic encapsulation layer is lower than a refractive index of the first encapsulation layer; and a refractive index of the bank layer is equal to or lower than a refractive index of the emission layer.

19. A light emitting display apparatus, comprising:

an overcoating layer on a substrate and including a base portion and a protrusion portion disposed on the base portion, the protrusion portion exposing a part of the base portion;

an uneven portion disposed on an upper surface of the protrusion portion;

a first electrode including a reflective layer on the overcoating layer and a transparent conductive layer on the reflective layer;

a bank layer configured to cover a part of the overcoating layer and a part of the first electrode, and to overlap with the uneven portion;

an emission layer on the first electrode and the bank layer; and a second electrode on the emission layer, wherein a distance between the reflective layer of the first electrode and the second electrode is configured to adjust to implement a constructive interference for light emitted from the emission layer, and wherein the uneven portion disposed on the upper surface of the protrusion portion which is parallel with the base portion or the substrate.

20. The light emitting display apparatus of claim 19, wherein the uneven portion has at least one of a concave semicircular shape, a triangular shape, an oval shape, and a trapezoidal shape.

21. The light emitting display apparatus of claim 19, wherein the uneven portion has a depth in a range of approximately 1.5 µm to approximately 2 µm.

* * * * *